US009972573B2

(12) United States Patent
Tao et al.

(10) Patent No.: US 9,972,573 B2
(45) Date of Patent: May 15, 2018

(54) WAFER-LEVEL PACKAGED COMPONENTS AND METHODS THEREFOR

(71) Applicant: Invensas Corporation, San Jose, CA (US)

(72) Inventors: Min Tao, San Jose, CA (US); Hoki Kim, Santa Clara, CA (US); Ashok S. Prabhu, San Jose, CA (US); Zhuowen Sun, Campbell, CA (US); Wael Zohni, San Jose, CA (US); Belgacem Haba, Saratoga, CA (US)

(73) Assignee: Invensas Corporation, San Jose, CA (US)

(\*) Notice: Subject to any disclaimer, the term of this patent is extended or adjusted under 35 U.S.C. 154(b) by 0 days. days.

(21) Appl. No.: 15/393,048

(22) Filed: Dec. 28, 2016

(65) Prior Publication Data

US 2018/0025987 A1    Jan. 25, 2018

Related U.S. Application Data

(60) Provisional application No. 62/365,763, filed on Jul. 22, 2016.

(51) Int. Cl.
*H01L 23/538* (2006.01)
*H01L 23/31* (2006.01)
(Continued)

(52) U.S. Cl.
CPC ........ *H01L 23/5389* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/5383* (2013.01); *H01L 23/5384* (2013.01);
(Continued)

(58) Field of Classification Search
CPC . H01L 23/5389; H01L 21/4853; H01L 25/50; H01L 21/565; H01L 21/486; H01L 21/4857; H01L 23/5383; H01L 25/105; H01L 23/3114; H01L 23/5386; H01L 23/5384; H01L 2225/1035; H01L 2225/1041
See application file for complete search history.

(56) References Cited

U.S. PATENT DOCUMENTS 7,141,873 B2   11/2006  Aoyagi
7,230,329 B2    6/2007  Sawamoto et al.
(Continued)

*Primary Examiner* — Roy Potter
*Assistant Examiner* — Paul Patton

(57) ABSTRACT

Wafer-level packaged components are disclosed. In a wafer-level-packaged, an integrated circuit die has first contacts in an inner third region of a surface of the integrated circuit die. A redistribution layer has second contacts in an inner third region of a first surface of the redistribution layer and third contacts in an outer third region of a second surface of the redistribution layer opposite the first surface thereof. The second contacts of the redistribution layer are coupled for electrical conductivity to the first contacts of the integrated circuit die with the surface of the integrated circuit die face-to-face with the first surface of the redistribution layer. The third contacts are offset from the second contacts for being positioned in a fan-out region for association at least with the outer third region of the second surface of the redistribution layer, the third contacts being surface mount contacts.

20 Claims, 20 Drawing Sheets

(51) Int. Cl.
*H01L 25/10* (2006.01)
*H01L 21/48* (2006.01)
*H01L 21/56* (2006.01)
*H01L 25/00* (2006.01)

(52) U.S. Cl.
CPC ........ *H01L 23/5386* (2013.01); *H01L 25/105* (2013.01); *H01L 25/50* (2013.01); *H01L 2225/1035* (2013.01); *H01L 2225/1041* (2013.01)

(56) References Cited

U.S. PATENT DOCUMENTS

| | | |
|---|---|---|
| 7,626,269 B2 | 12/2009 | Oliver et al. |
| 8,373,268 B2 | 2/2013 | Upadhyayula et al. |
| 8,404,520 B1 | 3/2013 | Chau et al. |
| 8,502,390 B2 | 8/2013 | Crisp et al. |
| 8,513,817 B2 | 8/2013 | Haba et al. |
| 8,780,600 B2 | 7/2014 | Fai et al. |
| 8,895,360 B2 | 11/2014 | Chang et al. |
| 9,349,706 B2 | 5/2016 | Co et al. |
| 2009/0085222 A1 | 4/2009 | Yamano |
| 2015/0364454 A1* | 12/2015 | Zhai ........................ H01L 25/18 257/693 |
| 2016/0013156 A1* | 1/2016 | Zhai .................... H01L 25/0657 257/777 |
| 2016/0148904 A1* | 5/2016 | Zhai .................... H01L 21/4853 257/777 |
| 2017/0025385 A1 | 1/2017 | Song et al. |

\* cited by examiner

WAFER-LEVEL PACKAGED COMPONENTS AND METHODS THEREFOR

CROSS-REFERENCE TO RELATED APPLICATIONS

This patent application claims the benefit of priority to U.S. Provisional Patent Application No. 62/365,763 to Tao et al., filed Jul. 22, 2016, and incorporated herein by reference in its entirety.

FIELD

The following description relates generally to integrated circuits ("ICs"). More particularly, the following description relates to wafer-level packaged components and methods therefor.

BACKGROUND

The trend in mobile package-on-package ("PoP") devices is to have a thinner overall "stackup". However, conventional PoP devices may be too thick and/or too expensive for some mobile device applications.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

DETAILED DESCRIPTION

Figure 1:
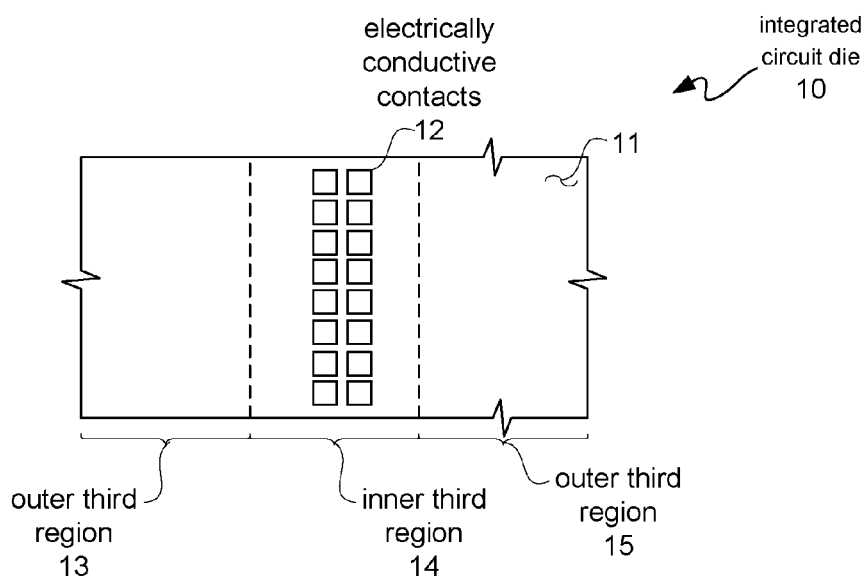
FIG. 1 is a block diagram illustratively depicting an exemplary a front side surface view of a conventional integrated circuit ("IC") die of an in-process wafer.

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

A first apparatus generally relates to a wafer-level packaged microelectronic component. In such an apparatus, an integrated circuit die has first contacts in an inner third region of a surface of the integrated circuit die. A redistribution layer has second contacts in an inner third region of a first surface of the redistribution layer and third contacts in an outer third region of a second surface of the redistribution layer opposite the first surface thereof. The second contacts of the redistribution layer are coupled for electrical conductivity to the first contacts of the integrated circuit die with the surface of the integrated circuit die face-to-face with the first surface of the redistribution layer. The third contacts are offset from the second contacts for being positioned in a fan-out region for association at least with the outer third region of the second surface of the redistribution layer, the third contacts being surface mount contacts.

For the first apparatus, the microelectronic component can have: the first contacts and the second contacts corresponding to one another; and the inner third region of each of the surface of the integrated circuit die and the first surface of the redistribution layer corresponding to one another.

For the first apparatus, the microelectronic component can have only the third contacts externally available for interconnection on the first surface of the redistribution layer.

For the first apparatus, the microelectronic component can have the integrated circuit die as part of a die stack.

For the first apparatus, the microelectronic component can have the redistribution layer as a first redistribution layer, and the surface of the integrated circuit die as a first surface thereof, where the microelectronic component can further include: a second redistribution layer having fourth contacts in an inner third region of a first surface of the second redistribution layer and interconnects in an outer third region of a second surface of the second redistribution layer opposite the first surface thereof; the integrated circuit die having through die vias in an outer third region of the first surface and a second surface opposite the first surface; the interconnects of the second redistribution layer coupled for electrical conductivity to the through die vias of the integrated circuit die with the second surface of the integrated circuit die face-to-face with the second surface of the second redistribution layer; and the interconnects offset from the fourth contacts for being positioned in the fan-out region for association at least with the outer third region of the second surface of the second redistribution layer.

For the first apparatus, the microelectronic component can have the integrated circuit die as a first integrated circuit die, where the microelectronic component can further include: a second integrated circuit die having fifth contacts in an inner third region of a surface of the second integrated circuit die; and the fourth contacts of the second redistribution layer coupled for electrical conductivity to the fifth contacts of the second integrated circuit die with the surface of the second integrated circuit die face-to-face with the first surface of the second redistribution layer.

A first method generally relates to forming a wafer-level packaged microelectronic component. In such a first method, obtained is an integrated circuit die having first contacts in an inner third region of a surface of the integrated circuit die. Wafer-level processing is used to form a redistribution layer on the surface of the integrated circuit die. The redistribution layer is formed to have: second contacts in an inner third region of a first surface of the redistribution layer interconnected to the first contacts of the integrated circuit die with the surface of the integrated circuit die face-to-face with the first surface of the redistribution layer; third contacts in an outer third region of a second surface of the redistribution layer opposite the first surface thereof coupled for electrical conductivity to the second contacts; and the third contacts offset from the second contacts for being positioned in a fan-out region for association at least with the outer third region of the second surface of the redistribution layer, the third contacts being surface mount contacts.

For the first method, the wafer-level packaged microelectronic component can have: the first contacts and the second contacts corresponding to one another; and the inner third region of each of the surface of the integrated circuit die and the first surface of the redistribution layer corresponding to one another.

For the first method, the wafer-level packaged microelectronic component can have only the third contacts externally available for interconnection on the second surface of the redistribution layer For the first method, the wafer-level packaged microelectronic component can have the integrated circuit die as part of a die stack.

A second method generally relates to forming a wafer-level packaged microelectronic component. In such a second method, obtain is an integrated circuit die having first contacts in an inner third region of a first surface of the integrated circuit die. Wafer-level processing is used to form a first redistribution layer on the first surface of the integrated circuit die. The first redistribution layer is formed to have: second contacts in an inner third region of a first surface of the first redistribution layer interconnected to the first contacts of the integrated circuit die with the first surface of the integrated circuit die face-to-face with the first surface of the first redistribution layer; third contacts in an outer third region of a second surface of the first redistribution layer opposite the first surface thereof coupled for electrical conductivity to the second contacts; and the third contacts offset from the second contacts for being positioned in a fan-out region for association at least with the outer third region of the second surface of the first redistribution layer, the third contacts being surface mount contacts. Wafer-level processing is used to form a second redistribution layer on a second surface of the integrated circuit die opposite the first surface thereof. The second redistribution layer is formed to have fourth contacts in an inner third region of a first surface of the second redistribution layer and interconnects in an outer third region of a second surface of the second redistribution layer opposite the first surface thereof. The integrated circuit die has through die vias in an outer third region of the first surface and a second surface opposite the first surface. The interconnects of the second redistribution layer are coupled for electrical conductivity to the through die vias of the integrated circuit die with the second surface of the integrated circuit die face-to-face with the second surface of the second redistribution layer. The interconnects are offset from the fourth contacts for being positioned in the fan-out region for association at least with the outer third region of the second surface of the second redistribution layer.

For the second method, the wafer-level packaged microelectronic component can have: the first contacts and the second contacts corresponding to one another; and the inner third region of each of the surface of the integrated circuit die and the first surface of the redistribution layer correspond to one another.

For the second method, the wafer-level packaged microelectronic component can have only the third contacts externally available for interconnection on the second surface of the redistribution layer For the second method, the wafer-level packaged microelectronic component can have the integrated circuit die is part of a die stack.

For the second method, the wafer-level packaged microelectronic component can have the integrated circuit die as a first integrated circuit die, the wafer-level packaged microelectronic component further including: obtaining a second integrated circuit die having fifth contacts in an inner third region of a surface of the second integrated circuit die; and surface mounting the second integrated circuit die for having the fourth contacts of the second redistribution layer coupled for electrical conductivity to the fifth contacts of the second integrated circuit die with the surface of the second integrated circuit die face-to-face with the first surface of the second redistribution layer.

For the second method, the wafer-level packaged microelectronic component can have at least one of the first integrated circuit die or the second integrated circuit die as part of a die stack.

A first package-on-package device includes: a package substrate; a first integrated circuit die surface mount coupled to an upper surface of the package substrate; first conductive lines coupled to the upper surface of the package substrate, the first conductive lines extending away from the upper surface of the package substrate to terminate at a first height; second conductive lines coupled to the upper surface of the package substrate, the second conductive lines extending away from the upper surface of the package substrate to terminate at a second height greater than the first height; the first conductive lines and the second conductive lines located in a fan-out region; a first molding layer formed over the upper surface of the package substrate, around sidewall surfaces of the first integrated circuit die, and around bases and shafts of the first conductive lines and the second conductive lines; a first wafer-level packaged microelectronic component and a second wafer-level packaged microelectronic component located above an upper surface of the first molding layer respectively surface mount coupled to a first and a second set of upper portions of the first conductive lines; and a third wafer-level packaged microelectronic component and a fourth wafer-level packaged microelectronic component located above the first and the second wafer-level packaged microelectronic component respectively surface mount coupled to a first and a second set of upper portions of the second conductive lines.

The first package-on-package device can have the first conductive lines and the second conductive lines respectively be first wire bond wires and second wire bond wires.

The first package-on-package device can have the package substrate as a laminate substrate having at least two layers.

The first package-on-package device can have the package substrate including a fan-out wafer-level redistribution layer.

The first package-on-package device can have: the integrated circuit die as a controller die; and each of the first, the second, the third, and the fourth wafer-level packaged microelectronic components including a respective memory die.

The first package-on-package device can have the first integrated circuit die and each of the first, the second, the third, and the fourth wafer-level packaged microelectronic components flip-chip coupled with flip-chip ball grid array interconnects.

The first package-on-package device can have the first integrated circuit die and each of the first, the second, the third, and the fourth wafer-level packaged microelectronic components flip-chip coupled with flip-chip land grid array interconnects.

The first package-on-package device can have surface area portions of each of the first wafer-level packaged microelectronic component, the second wafer-level packaged microelectronic component, the third wafer-level component, and the fourth wafer-level component overlap the first integrated circuit die.

The first package-on-package device can have surface area portions of each of the third wafer-level component and the fourth wafer-level component overlap the first integrated circuit die, the first wafer-level packaged microelectronic component, and the second wafer-level packaged microelectronic component.

The first package-on-package device can have the second wire bond wires in a range of approximately 50 to 75 microns taller than the first wire bond wires for coupling the first set and the second set of the upper portions of the second wire bond wires respectively to undersides of the third wafer-level packaged microelectronic component and the fourth wafer-level packaged microelectronic component; and the upper portions of the first wire bond wires providing approximately 0 to 50 microns extension above the upper surface of the first molding layer.

The first package-on-package device can have an overall package height of the package-on-package device in a range of approximately 0.5 to 0.8 millimeters.

The first package-on-package device can have the first wire bond wires and the second wire bond wires each having a pitch in a range of approximately 0.15 to 0.25 millimeters.

The first package-on-package device can have each of the first, the second, the third, and the fourth wafer-level packaged microelectronic components respectively including: a second integrated circuit die having first contacts in an inner third region of a front side surface of the second integrated circuit die; a redistribution layer having second contacts in an inner third region of a first outer surface of the redistribution layer and third contacts in an outer third region of a second outer surface of the redistribution layer opposite the first outer surface, the second and the third contacts interconnected to one another; the second contacts of the redistribution layer coupled to the first contacts of the second integrated circuit die with the front side surface of the second integrated circuit die face-to-face with the first outer surface of the redistribution layer; and the third contacts offset from the first contacts and the second contacts for being in a fan-out region associated at least with the outer third region of the second outer surface of the redistribution layer, the third contacts being flip-chip contacts.

The first package-on-package device can have the first conductive lines and the second conductive lines respectively be first conductive pillars and second conductive pillars.

The first package-on-package device can have tips of the upper portions of the first conductive pillars and the second conductive pillars providing bond pad-like surfaces.

The first package-on-package device can have the second conductive pillars in a range of approximately 50 to 75 microns taller than the first conductive pillars for coupling the first set and the second set of the upper portions of the second conductive pillars respectively to undersides of the third wafer-level packaged microelectronic component and the fourth wafer-level packaged microelectronic component.

The first package-on-package device can have the upper portions of the first conductive pillars providing approximately 0 to 50 microns extension above the upper surface of the first molding layer.

The first package-on-package device can have the first conductive pillars and the second conductive pillars each having a pitch in a range of approximately 0.15 to 0.25 millimeters.

The first package-on-package device can further include a second molding layer formed over the first molding layer for covering each of the first, the second, the third, and the fourth wafer-level packaged microelectronic components.

The first package-on-package device can have the first conductive lines and the second conductive lines respectively be first conductive vias and second conductive vias.

A third method generally relates to forming a package-on-package device. In such a method, obtained is a package substrate. First surface mount interconnecting is used for interconnecting a first integrated circuit die to an upper surface of the package substrate. First conductive lines are coupled to the upper surface of the package substrate, where the first conductive lines extend away from the upper surface of the package substrate to terminate at a first height. Second conductive lines are coupled to the upper surface of the package substrate, the second conductive lines extending away from the upper surface of the package substrate to terminate at a second height greater than the first height. The first conductive lines and the second conductive lines are located in a fan-out region. A first molding layer is formed over the upper surface of the package substrate, around sidewall surfaces of the first integrated circuit die, and around bases and shafts of the first conductive lines and the second conductive lines. Second surface mount interconnecting is used for interconnecting a first wafer-level packaged microelectronic component and a second wafer-level packaged microelectronic component above an upper surface of the first molding layer. The second surface mount interconnecting includes coupling a first and a second set of upper portions of the first conductive lines respectively to the first wafer-level packaged microelectronic component and the second wafer-level packaged microelectronic component. Third surface mount interconnecting is used for interconnecting a third wafer-level packaged microelectronic component and a fourth wafer-level packaged microelectronic component above the first and the second wafer-level packaged microelectronic components. The third surface mount interconnecting includes coupling a first and a second set of upper portions of the second conductive lines respectively to the third wafer-level packaged microelectronic component and the fourth wafer-level packaged microelectronic component.

For the third method, the first conductive lines and the second conductive lines can respectively be first wire bond wires and second wire bond wires.

For the third method, the first conductive lines and the second conductive lines can respectively be first conductive pillars and second conductive pillars.

For the third method, the first conductive lines and the second conductive lines can respectively be first conductive vias and second conductive vias.

For the third method, each of the first, the second, the third, and the fourth wafer-level packaged microelectronic components can respectively include: a second integrated circuit die having first contacts in an inner third region of a front side surface of the second integrated circuit die; a redistribution layer having second contacts in an inner third region of a first outer surface of the redistribution layer and third contacts in an outer third region of a second outer surface of the redistribution layer opposite the first outer surface, the second and the third contacts interconnected to one another; the second contacts of the redistribution layer coupled to the first contacts of the second integrated circuit die with the front side surface of the second integrated circuit die face-to-face with the first outer surface of the redistribution layer; and the third contacts offset from the first contacts and the second contacts for being in a fan-out region associated at least with the outer third region of the second outer surface of the redistribution layer, the third contacts being flip-chip contacts.

For the third method, the first integrated circuit die can be a controller die; and each of the first, the second, the third, and the fourth wafer-level packaged microelectronic components can include a respective memory die for the second integrated circuit die corresponding thereto.

For the third method, a second molding layer can be formed over the first molding layer for covering each of the first, the second, the third, and the fourth wafer-level packaged microelectronic components; and the package-on-package device can be diced from a reconstituted wafer.

For the third method, surface area portions of each of the first wafer-level packaged microelectronic component, the second wafer-level packaged microelectronic component, the third wafer-level component, and the fourth wafer-level component can overlap the first integrated circuit die.

For the third method, surface area portions of each of the third wafer-level component and the fourth wafer-level component can overlap the first integrated circuit die, the first wafer-level packaged microelectronic component, and the second wafer-level packaged microelectronic component.

A second package-on-package device includes: a package substrate; a first integrated circuit die surface mount coupled to an upper surface of the package substrate; conductive lines coupled to the upper surface of the package substrate in a fan-out region, the first conductive lines extending away from the upper surface of the package substrate; a molding layer formed over the upper surface of the package substrate, around sidewall surfaces of the first integrated circuit die, and around bases and shafts of the conductive lines; and wafer-level packaged microelectronic components located at a same level above an upper surface of the molding layer respectively surface mount coupled to sets of upper portions of the conductive lines.

The second package-on-package device can have the conductive lines as wire bond wires.

The second package-on-package device can have the package substrate as a laminate substrate having at least two layers.

The second package-on-package device can have the package substrate including a fan-out wafer-level redistribution layer.

The second package-on-package device can have: the first integrated circuit die as a controller die; and each of the wafer-level packaged microelectronic components including a respective memory die.

The second package-on-package device can have the conductive lines as conductive pillars.

The second package-on-package device can have the conductive lines as conductive vias.

The second package-on-package device can have an overall package height of the package-on-package device in a range of approximately to millimeters.

The second package-on-package device can have each of the wafer-level packaged microelectronic components respectively including: a second integrated circuit die having first contacts in an inner third region of a front side surface of the second integrated circuit die; a redistribution layer having second contacts in an inner third region of a first outer surface of the redistribution layer and third contacts in an outer third region of a second outer surface of the redistribution layer opposite the first outer surface, the second and the third contacts interconnected to one another; the second contacts of the redistribution layer coupled to the first contacts of the second integrated circuit die with the front side surface of the second integrated circuit die face-to-face with the first outer surface of the redistribution layer; and the third contacts offset from the first contacts and the second contacts for being in the fan-out region associated at least with the outer third region of the second outer surface of the redistribution layer, the third contacts being flip-chip contacts.

The second package-on-package device can have: the wafer-level packaged microelectronic components laid out to form a quadrangle-like shape defining an area in a center thereof; the third contacts in rows; the rows of nearest neighbors of the wafer-level packaged components orthogonal to one another; and the rows located proximate to an outer perimeter of the package substrate.

The second package-on-package device can have: the wafer-level packaged microelectronic components laid out to form a quadrilateral-like shape; the third contacts in rows; the rows of a first two of the wafer-level packaged components in parallel with one another to form first extended rows; the rows of a second two of the wafer-level packaged components parallel with one another to form second extended rows; and the first extended rows and the second extended rows opposite one another and located proximate to an outer perimeter of the package substrate.

The second package-on-package device can have each of the wafer-level packaged microelectronic components respectively including: a second integrated circuit die having contacts in an inner third region of a front side surface of the second integrated circuit die; the wafer-level packaged microelectronic components are laid out to form a quadrilateral-like shape; first rows of the contacts of a first two of the wafer-level packaged components are parallel with one another to form first extended rows; second rows of the contacts of a second two of the wafer-level packaged components are parallel with one another to form second extended rows; and the first extended rows and the second extended rows are opposite and parallel with one another.

The second package-on-package device can have each of the wafer-level packaged microelectronic components respectively including: a second integrated circuit die having contacts in an inner third region of a front side surface of the second integrated circuit die; the wafer-level packaged microelectronic components laid out to form a cross-like shape; first rows of the contacts of a first two of the wafer-level packaged components parallel with and opposite one another; and second rows of the contacts of a second two of the wafer-level packaged components parallel with and opposite one another and orthogonal to the first rows.

The second package-on-package device can have surface area portions of each of the wafer-level packaged microelectronic components overlap the first integrated circuit die.

A fourth method generally relates to forming a package-on-package device. In such a method, obtained is a package substrate. First surface mount interconnecting is used for interconnecting a first integrated circuit die to an upper surface of the package substrate. Conductive lines are coupled to the upper surface of the package substrate in a fan-out region, the conductive lines extending away from the upper surface of the package substrate. A molding layer is formed over the upper surface of the package substrate, around sidewall surfaces of the first integrated circuit die, and around bases and shafts of the conductive lines. Second surface mount interconnecting is used for interconnecting wafer-level packaged microelectronic components above an upper surface of the first molding layer, the second surface mount interconnecting including coupling sets of upper portions of the conductive lines respectively to the wafer-level packaged microelectronic components.

For the fourth method, each of the wafer-level packaged microelectronic components can respectively include: a second integrated circuit die having first contacts in an inner third region of a front side surface of the second integrated circuit die; a redistribution layer having second contacts in an inner third region of a first outer surface of the redistribution layer and third contacts in an outer third region of a second outer surface of the redistribution layer opposite the first outer surface, the second and the third contacts interconnected to one another; the second contacts of the redistribution layer coupled to the first contacts of the second integrated circuit die with the front side surface of the second integrated circuit die face-to-face with the first outer surface of the redistribution layer; and the third contacts offset from the first contacts and the second contacts for being in the fan-out region associated at least with the outer third region of the second outer surface of the redistribution layer, the third contacts being flip-chip contacts.

For the fourth method, surface area portions of each of the wafer-level packaged microelectronic components can overlap the first integrated circuit die.

A dies-on-package device, includes: a package substrate; a first integrated circuit die surface mount coupled to an upper surface of the package substrate; conductive lines coupled to the upper surface of the package substrate in a fan-out region with respect to the first integrated circuit die, the first conductive lines extending away from the upper surface of the package substrate; a molding layer formed over the upper surface of the package substrate, around sidewall surfaces of the first integrated circuit die, and around bases and shafts of the conductive lines; and a plurality of second integrated circuit dies located at a same level above an upper surface of the molding layer respectively surface mount coupled to sets of upper portions of the conductive lines. The plurality of second integrated circuit dies are respectively coupled to the sets of the conductive lines in middle third portions respectively of the plurality of second integrated circuit dies for corresponding fan-in regions thereof.

The dies-on-package device can have the conductive lines as wire bond wires.

The dies-on-package device can have the package substrate as a laminate substrate having at least two layers.

The dies-on-package device can have the package substrate including a fan-out wafer-level redistribution layer.

The dies-on-package device can have: the first integrated circuit die as a controller die; and each of the wafer-level packaged microelectronic components including a respective memory die.

The dies-on-package device can have the conductive lines as conductive pillars.

The dies-on-package device can have the conductive lines as conductive vias.

The dies-on-package device can have an overall package height of the dies-on-package device is in a range of approximately _ to _ millimeters.

The dies-on-package device can have: the plurality of second integrated circuit dies laid out to form a quadrangle-like shape defining an area in a center thereof; contacts of the plurality of second integrated circuit dies located in the middle third region in rows; and the rows of nearest neighbors of the plurality of second integrated circuit dies orthogonal to one another.

The dies-on-package device can have: the plurality of second integrated circuit dies laid out to form a quadrilateral-like shape; contacts of the plurality of second integrated circuit dies located in the middle third region in rows; the rows of a first two of the plurality of second integrated circuit dies parallel with one another to form first extended rows; the rows of a second two of the plurality of second integrated circuit dies parallel with one another to form second extended rows; and the first extended rows and the second extended rows opposite and parallel with one another.

The dies-on-package device can have surface area portions of each of the plurality of second integrated circuit dies overlap the first integrated circuit die.

The dies-on-package device can have the plurality of second integrated circuit dies as a first plurality of second integrated circuit dies, and the sets of upper portions of the conductive lines as first sets of upper portions of the conductive lines, the dies-on-package device can further include: a second plurality of second integrated circuit dies located at a same level above upper surfaces of the first plurality of integrated circuit dies respectively surface mount coupled to second sets of upper portions of the conductive lines; and the second plurality of second integrated circuit dies respectively coupled to the second sets of the conductive lines in middle third portions respectively of the second plurality of second integrated circuit dies for corresponding fan-in regions thereof.

The dies-on-package device can have the conductive lines as wire bond wires.

The dies-on-package device can have surface area portions of each of the first plurality of second integrated circuit dies and the second plurality of second integrated circuit dies overlap the first integrated circuit die.

The dies-on-package device can have surface area portions of each of the second plurality of second integrated circuit dies overlap the first integrated circuit die and the first plurality of second integrated circuit dies.

A fifth method relates generally to forming a dies-on-package device. In such a method, obtained is a package substrate. First surface mount interconnecting is used for interconnecting a first integrated circuit die to an upper surface of the package substrate. Conductive lines are coupled to the upper surface of the package substrate in a fan-out region, the conductive lines extending away from the upper surface of the package substrate. A molding layer is formed over the upper surface of the package substrate, around sidewall surfaces of the first integrated circuit die, and around bases and shafts of the conductive lines. Second surface mount interconnecting is used for interconnecting a plurality of second integrated circuit dies above an upper surface of the first molding layer. The second surface mount interconnecting includes coupling sets of upper portions of the conductive lines respectively to the plurality of second integrated circuit dies for corresponding fan-in regions thereof.

For the fifth method, surface area portions of each of the plurality of second integrated circuit dies can overlap the first integrated circuit die.

For the fifth method, the plurality of second integrated circuit dies is a first plurality of second integrated circuit dies, and the sets of upper portions of the conductive lines are first sets of upper portions of the conductive lines, the fifth method can further include: third surface mount interconnecting a second plurality of second integrated circuit dies located at a same level above upper surfaces of the first plurality of integrated circuit dies to second sets of upper portions of the conductive lines; and the second plurality of second integrated circuit dies respectively coupled to the second sets of the conductive lines in middle third portions respectively of the second plurality of second integrated circuit dies for corresponding fan-in regions thereof.

For the fifth method, surface area portions of each of the second plurality of second integrated circuit dies can overlap the first integrated circuit die and the first plurality of second integrated circuit dies.

A third package-on-package device includes: a package substrate; a first integrated circuit die surface mount coupled to an upper surface of the package substrate; conductive lines coupled to the upper surface of the package substrate in a fan-out region, the first conductive lines extending away from the upper surface of the package substrate; a molding layer formed over the upper surface of the package substrate, around sidewall surfaces of the first integrated circuit die, and around bases and shafts of the conductive lines; a first and a second wafer-level packaged microelectronic component located at a same level above an upper surface of the molding layer respectively surface mount coupled to sets of upper portions of the conductive lines; each of the first and the second wafer-level packaged microelectronic components having a second integrated circuit die located between a first redistribution layer and a second redistribution layer; and a third and a fourth integrated circuit die respectively surface mount coupled over the first and the second wafer-level packaged microelectronic components.

The third package-on-package device can have each of the first and the second wafer-level packaged microelectronic components including: the second integrated circuit die having first contacts in an inner third region of a first surface of the second integrated circuit die; the first redistribution layer having second contacts in an inner third region of a first surface of the first redistribution layer and third contacts in an outer third region of a second surface of the first redistribution layer opposite the first surface thereof; the second contacts of the first redistribution layer coupled for electrical conductivity to the first contacts of the second integrated circuit die with the first surface of the second integrated circuit die face-to-face with the first surface of the first redistribution layer; and the third contacts offset from the second contacts for being positioned in a fan-out region for association at least with the outer third region of the second surface of the first redistribution layer, the third contacts being surface mount contacts.

The third package-on-package device can have each of the first and the second wafer-level packaged microelectronic components including: the second redistribution layer having fourth contacts in an inner third region of a first surface of the second redistribution layer and interconnects in an outer third region of a second surface of the second redistribution layer opposite the first surface thereof; the second integrated circuit die having through die vias in an outer third region of the first surface and a second surface opposite the first surface; the interconnects of the second redistribution layer coupled for electrical conductivity to the through die vias of the second integrated circuit die with the second surface of the second integrated circuit die face-to-face with the second surface of the second redistribution layer; and the interconnects offset from the fourth contacts for being positioned in the fan-out region for association at least with the outer third region of the second surface of each of the first redistribution layer and the second redistribution layer.

The third package-on-package device can have each of the third and the fourth integrated circuit dies including fifth contacts in an inner third region of respective surfaces of the third and the fourth integrated circuit dies.

The third package-on-package device can have the fourth contacts of the second redistribution layer for each of the first and the second wafer-level packaged microelectronic components coupled for electrical conductivity respectively to the fifth contacts of the third and the fourth integrated circuit dies, respectively, with the respective surfaces of the third and the fourth integrated circuit dies face-to-face with the first surface of the second redistribution layer of the first and the second wafer-level packaged microelectronic components, respectively.

The third package-on-package device can have the conductive lines as wire bond wires.

The third package-on-package device can have the package substrate including a fan-out wafer-level redistribution layer.

The third package-on-package device can have: the first integrated circuit die as a controller die; each of the first and the second wafer-level packaged microelectronic component including a respective first memory die; and the second and the third integrated circuit die as respective second memory dies.

The third package-on-package device can have the conductive lines as conductive pillars.

The third package-on-package device can have the conductive lines as conductive vias.

A sixth method generally relates to forming a package-on-package device. In such a method, obtained is a package substrate. First surface mount coupling is used for coupling a first integrated circuit die to an upper surface of the package substrate. Conductive lines are coupled to the upper surface of the package substrate in a fan-out region, the first conductive lines extending away from the upper surface of the package substrate. A molding layer is formed over the upper surface of the package substrate, around sidewall surfaces of the first integrated circuit die, and around bases and shafts of the conductive lines. Second surface mount coupling is used for coupling a first and a second wafer-level packaged microelectronic component located at a same level above an upper surface of the molding layer respectively to sets of upper portions of the conductive lines. Each of the first and the second wafer-level packaged microelectronic components have a second integrated circuit die located between a first redistribution layer and a second redistribution layer. Third surface mount coupling is used for coupling a third and a fourth integrated circuit die respectively over the first and the second wafer-level packaged microelectronic components.

For the sixth method, each of the first and the second wafer-level packaged microelectronic components can include: the second integrated circuit die having first contacts in an inner third region of a first surface of the second integrated circuit die; the first redistribution layer having second contacts in an inner third region of a first surface of the first redistribution layer and third contacts in an outer third region of a second surface of the first redistribution layer opposite the first surface thereof; the second contacts of the first redistribution layer coupled for electrical conductivity to the first contacts of the second integrated circuit die with the first surface of the second integrated circuit die face-to-face with the first surface of the first redistribution layer; and the third contacts offset from the second contacts for being positioned in a fan-out region for association at least with the outer third region of the second surface of the first redistribution layer, the third contacts being surface mount contacts.

For the sixth method, each of the first and the second wafer-level packaged microelectronic components can include: the second redistribution layer having fourth contacts in an inner third region of a first surface of the second redistribution layer and interconnects in an outer third region of a second surface of the second redistribution layer opposite the first surface thereof; the second integrated circuit die having through die vias in an outer third region of the first surface and a second surface opposite the first surface; the interconnects of the second redistribution layer coupled for electrical conductivity to the through die vias of the second integrated circuit die with the second surface of the second integrated circuit die face-to-face with the second surface of the second redistribution layer; and the interconnects offset from the fourth contacts for being positioned in the fan-out region for association at least with the outer third region of the second surface of each of the first redistribution layer and the second redistribution layer.

For the sixth method, each of the third and the fourth integrated circuit dies can include fifth contacts in an inner third region of respective surfaces of the third and the fourth integrated circuit dies.

For the sixth method, the third surface mount coupling can include coupling the fourth contacts of the second redistribution layer for each of the first and the second wafer-level packaged microelectronic components for electrical conductivity respectively to the fifth contacts of the third and the fourth integrated circuit dies, respectively, with the respective surfaces of the third and the fourth integrated circuit dies face-to-face with the first surface of the second redistribution layer of the first and the second wafer-level packaged microelectronic components, respectively.

For the sixth method, the conductive lines can be wire bond wires.

For the sixth method, the package substrate can include a fan-out wafer-level redistribution layer.

For the sixth method, the first integrated circuit die can be a controller die; each of the first and the second wafer-level packaged microelectronic component can include a respective first memory die for the second integrated circuit die respectively thereof; and the second and the third integrated circuit die can be respective second memory dies.

For the sixth method, the conductive lines can be conductive pillars.

For the sixth method, the conductive lines can be conductive vias.

A second apparatus generally relates to a wafer-level packaged microelectronic component. In such an apparatus, an integrated circuit die has first contacts in an inner third region of a first surface of the integrated circuit die and through die vias in an outer third region of the first surface of the integrated circuit die. A redistribution layer has second contacts in an inner third region of a first surface of the redistribution layer and interconnects in an outer third region of a second surface of the redistribution layer opposite the first surface thereof. The interconnects of the redistribution layer are coupled for electrical conductivity to the through substrate vias of the integrated circuit die with a second surface of the integrated circuit die opposite the first surface thereof face-to-face with the second surface of the redistribution layer. The second contacts offset from the interconnects for being positioned in a fan-out region for association at least with the outer third region of the second surface of the redistribution layer, the second contacts being surface mount contacts.

The second apparatus can have the inner third region of each of the first surface of the integrated circuit die and the first surface of the redistribution layer correspond to one another.

The second apparatus can have the integrated circuit die as a first integrated circuit die, the microelectronic component can further include: a second integrated circuit die having third contacts in an inner third region of a surface of the second integrated circuit die; and the second contacts of the second redistribution layer coupled for electrical conductivity to the third contacts of the second integrated circuit die with the surface of the second integrated circuit die face-to-face with the first surface of the second redistribution layer.

A seventh method relates generally to forming a wafer-level packaged microelectronic component. In such a method, obtained is an integrated circuit die having first contacts in an inner third region of a first surface of the integrated circuit die and through die vias in an outer third region of the first surface of the integrated circuit die. Wafer-level processing is used to form a redistribution layer on the first surface of the integrated circuit die. The redistribution layer is formed to have: second contacts in an inner third region of a first surface of the redistribution layer and interconnects in an outer third region of a second surface of the redistribution layer opposite the first surface thereof; the interconnects of the redistribution layer coupled for electrical conductivity to the through substrate vias of the integrated circuit die with a second surface of the integrated circuit die opposite the first surface thereof face-to-face with the second surface of the redistribution layer; and the second contacts offset from the interconnects for being positioned in a fan-out region for association at least with the outer third region of the second surface of the redistribution layer, the second contacts being surface mount contacts.

For the seventh method, the integrated circuit die can be a first integrated circuit die, and the seventh method can further include: obtaining a second integrated circuit die having third contacts in an inner third region of a surface of the second integrated circuit die; and coupling the second contacts of the second redistribution layer for electrical conductivity to the third contacts of the second integrated circuit die with the surface of the second integrated circuit die face-to-face with the first surface of the second redistribution layer.

A fourth package-on-package device includes: a package substrate; a first integrated circuit die surface mount coupled to an upper surface of the package substrate; conductive lines coupled to the upper surface of the package substrate in a fan-out region with reference to the first integrated circuit, the first conductive lines extending away from the upper surface of the package substrate; a molding layer formed over the upper surface of the package substrate, around sidewall surfaces of the first integrated circuit die, and around bases and shafts of the conductive lines; a first and a second wafer-level packaged microelectronic component located at a same level above an upper surface of the molding layer respectively surface mount coupled to sets of upper portions of the conductive lines; each of the first and the second wafer-level packaged microelectronic components having a second integrated circuit die located below a first redistribution layer respectively thereof; and a third and a fourth integrated circuit die respectively surface mount coupled over the first and the second wafer-level packaged microelectronic components.

The fourth package-on-package device can have each of the first and the second wafer-level packaged microelectronic components include: the second integrated circuit die having first contacts in an inner third region of a first surface of the second integrated circuit die and through die vias in an outer third region of the first surface of the second integrated circuit die; the first redistribution layer having second contacts in an inner third region of a first surface of the first redistribution layer and interconnects in an outer third region of a second surface of the first redistribution layer opposite the first surface thereof; the interconnects of the first redistribution layer coupled for electrical conductivity to the through substrate vias of the second integrated circuit die with a second surface of the second integrated circuit die opposite the first surface thereof face-to-face with the second surface of the first redistribution layer; and the second contacts offset from the interconnects for being positioned in the fan-out region for association at least with the outer third region of the second surface of the first redistribution layer, the second contacts being surface mount contacts.

The fourth package-on-package device can have the third and the fourth integrated circuits each include third contacts in an inner third region of a surface of each of the third and the fourth integrated circuits.

The fourth package-on-package device can have the second contacts of the first redistribution layer respectively of the first and the second wafer-level packaged microelectronic components coupled for electrical conductivity to the third contacts of the third and the fourth integrated circuits, respectively.

The fourth package-on-package device can have the conductive lines as wire bond wires.

The fourth package-on-package device can have the package substrate include a second redistribution layer.

The fourth package-on-package device can have: a second redistribution layer located on the upper surface of the molding layer; and the first and the second wafer-level packaged microelectronic components located at the same level above the second redistribution layer respectively surface mount coupled to the sets of upper portions of the conductive lines.

The fourth package-on-package device can have: the first integrated circuit die as a controller die; each of the first and the second wafer-level packaged microelectronic component including a respective first memory die for the second integrated circuit die; and the third and the fourth integrated circuit dies as respective second memory dies.

The fourth package-on-package device can have the conductive lines as conductive pillars.

The fourth package-on-package device can have the conductive lines as conductive vias.

An eighth method generally relates to forming a package-on-package device. In such a method, obtained is a package substrate. First surface mount coupling is used to couple a first integrated circuit die to an upper surface of the package substrate. Conductive lines are coupled to the upper surface of the package substrate in a fan-out region, the first conductive lines extending away from the upper surface of the package substrate. A molding layer is formed over the upper surface of the package substrate, around sidewall surfaces of the first integrated circuit die, and around bases and shafts of the conductive lines. Second surface mount coupling is used to couple a first and a second wafer-level packaged microelectronic component located at a same level above an upper surface of the molding layer respectively to sets of upper portions of the conductive lines. Each of the first and the second wafer-level packaged microelectronic components have a second integrated circuit die located below a first redistribution layer respectively thereof. Third surface mount coupling is used to couple a third and a fourth integrated circuit die respectively over the first and the second wafer-level packaged microelectronic components.

For the eighth method, each of the first and the second wafer-level packaged microelectronic components can include: the second integrated circuit die having first contacts in an inner third region of a first surface of the second integrated circuit die and through die vias in an outer third region of the first surface of the second integrated circuit die; the first redistribution layer having second contacts in an inner third region of a first surface of the first redistribution layer and interconnects in an outer third region of a second surface of the first redistribution layer opposite the first surface thereof; the interconnects of the first redistribution layer coupled for electrical conductivity to the through substrate vias of the second integrated circuit die with a second surface of the second integrated circuit die opposite the first surface thereof face-to-face with the second surface of the first redistribution layer; and the second contacts offset from the interconnects for being positioned in the fan-out region for association at least with the outer third region of the second surface of the first redistribution layer, the second contacts being surface mount contacts.

For the eighth method, the third and the fourth integrated circuits each can include third contacts in an inner third region of a surface of each of the third and the fourth integrated circuits.

For the eighth method, the second contacts of the first redistribution layer respectively of the first and the second wafer-level packaged microelectronic components can be coupled for electrical conductivity to the third contacts of the third and the fourth integrated circuits, respectively.

For the eighth method, the conductive lines can be wire bond wires.

For the eighth method, the package substrate can include a second redistribution layer.

For the eighth method, a second redistribution layer can be located on the upper surface of the molding layer; and the first and the second wafer-level packaged microelectronic components can be located at the same level above the second redistribution layer respectively surface mount coupled to the sets of upper portions of the conductive lines.

For the eighth method, the first integrated circuit die can be a controller die; each of the first and the second wafer-level packaged microelectronic component can include a respective first memory die for the second integrated circuit die; and the third and the fourth integrated circuit dies can be respective second memory dies.

For the eighth method, the conductive lines can be conductive pillars.

For the eighth method, the conductive lines can be conductive vias.

Other features will be recognized from consideration of the remainder of the Detailed Description and Claims, which follow.

FIG. 1 is a block diagram illustratively depicting an exemplary a front side surface view of a conventional integrated circuit ("IC") die 10 of an in-process wafer. In this example, IC die 10 is a memory die; however, in another example another type of IC die may be used. Moreover, even though an IC die 10 is described in this example, in another implementation IC die 10 may be or may be part of a die stack of two or more IC dies including IC die 10 on the bottom thereof.

IC die 10 has contacts 12 in an inner third region 14 of a front side surface 11 of IC die 10. A left outer third region 13 and a right outer third region 15 are located on opposite sides of inner third region 14. In other words, an inner stripe equal to or approximately a third of the area of front side surface 11 is taken up by inner third region 14.

In this example, electrically conductive contacts 12, which may include metal pads for example, are all completely located within inner third region 14. Furthermore, in this example all externally accessible contacts of IC die 10 are located completely within inner third region 14 of front side surface 11, and thus there is no other externally accessible electrically conductive contact(s) for IC die 10 other than those of contacts 12. In other words, only contacts 12 are externally available for interconnection on front side surface 11 of IC die 10.

Though an 8-by-2 array of contacts 12 is illustratively depicted in this example, an array of another size may be used as may vary with respect to IC die types. Moreover, though 16 contacts 12 are illustratively depicted, another number of contacts may be implemented. Furthermore, contacts 12 may be flip-chip contacts, such as flip-chip ball grid array ("BGA") contacts (including without limitation micro-BGA contacts), flip-chip land grid array ("LGA") contacts, or higher density contacts.

Figure 2:
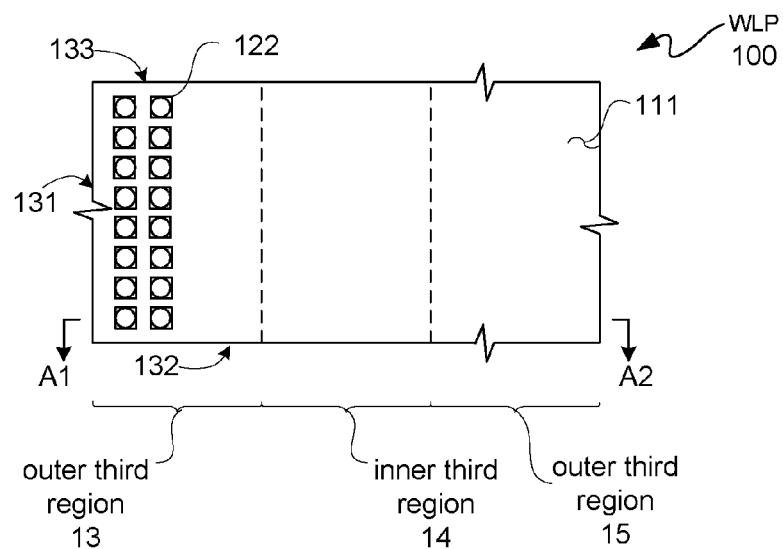
FIG. 2 is a block diagram illustratively depicting an exemplary lower side surface view of a microelectronic component, namely a wafer-level packaging or wafer-level packaged ("WLP") microelectronic component of an in-process wafer.
Figure 3:
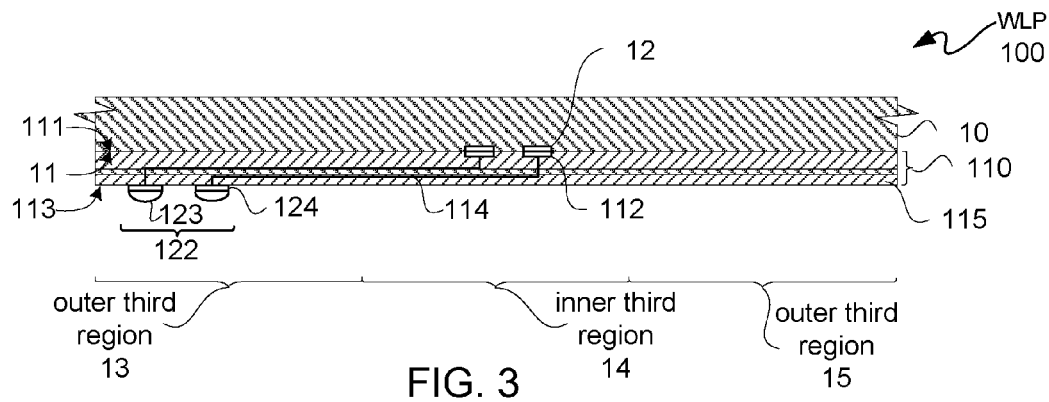
FIG. 3 is a block diagram illustratively depicting an exemplary cross-sectional side view of WLP microelectronic component of FIG. 2 along A1-2A.

FIG. 2 is a block diagram illustratively depicting an exemplary lower side surface view of a microelectronic component, namely a wafer-level packaging or wafer-level packaged ("WLP") microelectronic component 100 of an in-process wafer, and FIG. 3 is a block diagram illustratively depicting an exemplary cross-sectional side view of WLP microelectronic component 100 of FIG. 2 along A1-A2. WLP microelectronic component 100 is further described with simultaneous reference to FIGS. 2 and 3.

In addition to IC die 10, WLP includes a redistribution layer ("RDL") 110. RDL 110 has contacts 112 in an inner third region 14 of an upper outer surface 113 of RDL 110. Contacts 112 may be a surface-mount technology ("SMT") contacts, such as flip-chip contacts 112 for example. Flip-chip contacts 112, such as flip-chip ball grid array ("BGA") contacts (including without limitation micro-BGA contacts), flip-chip land grid array ("LGA") contacts, or higher density contacts, may be used to provide a surface-mount device ("SMD") for a WLP component 100. In another implementation, an integrated fan out WLP ("InFO") may be used to provide an even thinner package with an even tighter RDL pitch, such as approximately 10 um.

Electrically conductive contacts 112 of RDL 110 may be correspondingly coupled to contacts 12 of IC die 10 with the front side surface 11 of IC die 10 face-to-face with upper outer surface 113 of RDL 110. Even though contacts 112 are illustratively depicted as recessed contacts, contacts 112 may be recessed, partially recessed (i.e., partially protrude above surface 111), or formed on an uppermost portion of surface 111, namely "surface contacts". Likewise, even though contacts 12 are illustratively depicted as recessed contacts, contacts 12 may be recessed, partially recessed (i.e., partially protrude below surface 11), or formed on an uppermost portion of surface 11.

RDL 110 may have contacts 122 in an outer third region 13 of a lower outer surface 113 of RDL 110 opposite upper outer surface 111. Even though contacts 122 are illustratively depicted as surface contacts, contacts 122 may be recessed, partially recessed (i.e., partially protrude below surface 113), or surface contacts. Furthermore, contacts 122 may be flip-chip contacts, such as flip-chip ball grid array ("BGA") contacts (including without limitation micro-BGA contacts), flip-chip land grid array ("LGA") contacts, or contacts of equivalent density. Along those lines, because contacts 122 may be fanned-out with respect to contacts 112, contacts 122 may be of a lower density, namely a larger pitch, than contacts 112 or 12. However, for purposes of clarity by way of example and not limitation, it shall be assumed that contacts 12 and 112 are flip-chip micro-BGA ("uBGA") contacts and that contacts 122 are flip-chip BGA contacts, which are fanned out with respect to contacts 112.

RDL 110 may have one or more conductive routing layers 114 coupled between contacts 112 and contacts 122 for interconnection therebetween. RDL 110 may have one or more dielectric layers 115 included with one or more conductive routing layers 114. Electrically conductive contacts 122 may be offset from contacts 12 and contacts 112 for being located or otherwise positioned in a fan-out or fanned-out interconnect region, where such fan-out interconnect region is defined to include at least outer third region 13 of lower outer surface 113 of RDL 110.

In this example implementation, electrically conductive contacts 112, which may include metal pads for example, are all completely located within inner third region 14 of upper outside surface 111 of RDL 110. Furthermore, in this example all externally accessible contacts of upper outside surface 111 of RDL 110 are located completely within inner third region 14 of upper outside surface 111, and thus there is no other externally accessible electrically conductive contact(s) for interconnection with IC die 10 other than those of contacts 112.

In this example implementation, contacts 122, which may include WLP metal pads 124 and solder bumps 123 for example, are all completely located within a left outer third region 13 of lower outside surface 113 of RDL 110. Furthermore, in this example all externally accessible contacts of lower outside surface 113 of RDL 110 are located completely within left outer third region 13 of lower outside surface 113, and thus there is no other externally accessible electrically conductive contact(s) for interconnection other than those of contacts 122.

Again, though an 8-by-2 array of contacts 122 is illustratively depicted in this example, an array of another size may be used as may vary with respect to corresponding IC die types. Moreover, though 16 contacts 122 are illustratively depicted, another number of contacts may be implemented.

In this example, there is a one-to-one correspondence between contacts 12 and contacts 112. Moreover, in this example, there is a one-to-one correspondence between contacts 112 and contacts 122. However, in another implementation one or more of such one-to-one correspondences may or may not be present.

The inner third region 14 of each of front side surface 11 and upper outer surface 111 correspond to one another. Moreover, in this example, surface areas of surfaces 11 and 111 may be equal to or approximately equal to one another.

Though in this example, contacts 122 are confined to a left outer third region 13 with no other externally accessible contacts on a surface, recessed, or partially recessed with respect to lower outer surface 113, in another implementation such contacts 122 may be in any one or more of regions 13-15 for providing fanned-out interconnects, as will be appreciated from the following description.

WLP microelectronic component 100 may be of a wafer, such as a semiconductor wafer for example. RDL 110 may be added to IC die 10 as part of a WLP, with dicing of WLP microelectronic component 100 from a reconstituted wafer following formation of RDL 110, which may include formation of solder bumps, solder balls, or other eutectic masses 123 on WLP metal pads 124 prior to dicing for singulation of each WLP microelectronic component 100 from such reconstituted wafer. However, in another implementation, IC die 10 may be an individual die, namely not part of a reconstituted wafer, when RDL 110 is added. Likewise, package substrate 210 may be an individual substrate and not part of a reconstituted wafer when attaching wire bond wires and integrated circuit die 201. However, for purposes of clarity by way of example and not limitation, it shall be assumed that a reconstituted wafer is used.

Having offset or skewed memory WLP metal pads 124 of contacts 122 may be used to facilitate a small package outline, namely a small package area with a fanned-out region, as well as to limit vertical height of overall stackup. Along the latter lines, WLP metal pads 124 may be for flip-chip interconnects, such as for WLP metal pads 124 being flip-chip BGA contacts for example, which may be positioned along any one or more of sides 131, 132, or 133 of WLP microelectronic component 100.

Figure 4:
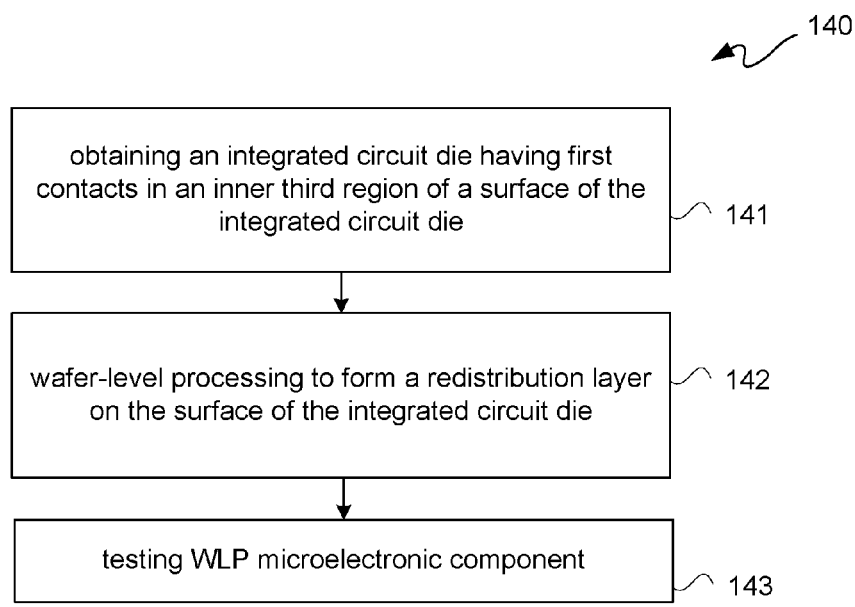
FIG. 4 is a flow diagram illustratively depicting an exemplary process flow for forming a WLP microelectronic component.

FIG. 4 is a flow diagram illustratively depicting an exemplary process flow 140 for forming a WLP microelectronic component 100. With simultaneous reference to FIGS. 2-4, process flow 140 is further described.

At 141, obtained is an integrated circuit die 10 having contacts 12 in an inner third region 14 of a surface 11 of integrated circuit die 10. At 142, integrated circuit die 10 is wafer-level processed to form a redistribution layer 110 on surface 11 of integrated circuit die 10. Redistribution layer 110 may be formed to have contacts 112 in an inner third region 14 of a surface 111 of redistribution layer 110 interconnected to contacts 12 of integrated circuit die 10 with surface 11 of integrated circuit die 10 face-to-face with surface 111 of redistribution layer 110. Contacts 122 in an outer third region 13, or 15, of a surface 113 of redistribution layer 110 opposite surface 111 thereof may be coupled for electrical conductivity to contacts 112. Contacts 122 are offset from contacts 12 for being positioned in a fan-out interconnect region for association at least with outer third region 13, or 15, of surface 111 of redistribution layer 110, where contacts 122 are flip-chip contacts.

In this implementation, contacts 12 and 112 may correspond to one another, and inner third region 14 of each of surfaces 11 and 111 may correspond to one another. In this implementation, only contacts 122 may be externally available for interconnection on surface 113 of redistribution layer 110. At 143, a WLP microelectronic component 100 may be tested at a wafer-level or after being diced, including without limitation being diced from a semiconductor or other wafer used to form IC die 10.

Figure 5:
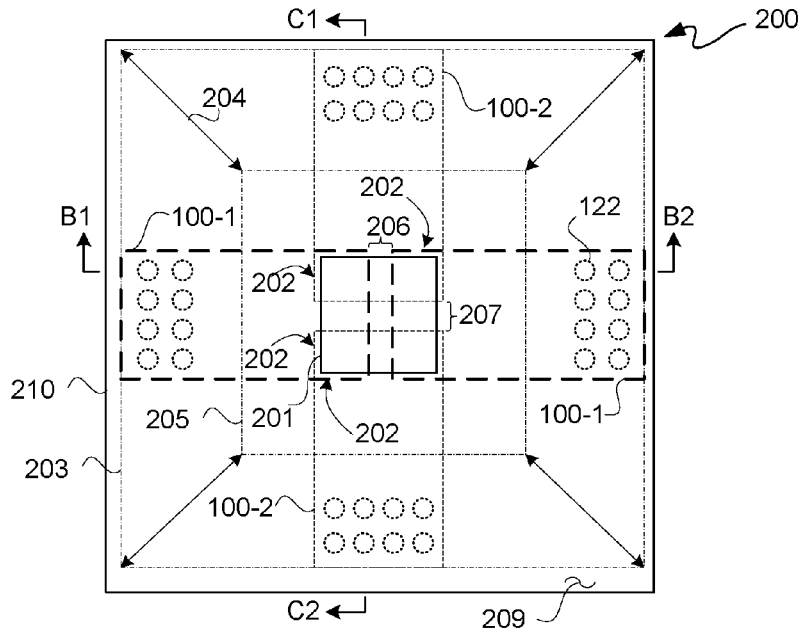
FIG. 5 is a top-down view of a block diagram illustratively depicting an exemplary package-on-package ("PoP") device.

FIG. 5 is a top-down view of a block diagram illustratively depicting an exemplary package-on-package ("PoP") device 200. PoP device 200 includes a package substrate 210 upon a surface 209 of which an integrated circuit die 201, such as an application specific die for example, may be coupled along with conductive lines. Though an integrated circuit die 201 is illustratively depicted, in another implementation integrated circuit die 201 may be a die stack of two or more integrated circuit dies.

A layer of molding material ("molding layer") may be formed on such a surface 209 of package substrate 210. While one or more layers, such as one or more passivation, dielectric, and/or routing layers, may be formed on a surface 209 of package substrate 210, for purposes of clarity these one or more intervening surfaces collectively and singly are considered within the term an upper surface 209 of package substrate 210.

Integrated circuit die 201 may be flip-chip coupled to an upper surface 209 of package substrate 210. In this example, four WLP microelectronic components 100 are shown in phantom to indicate generally when such components are to be coupled relative to integrated circuit die 201. WLP microelectronic components 100-1 are at a first WLP tier above integrated circuit die 201, and WLP microelectronic components 100-2 are at a second WLP tier above such first WLP tier. Along those lines, portions 202 of WLP microelectronic components 100-1 are above and over, namely partially overlapping, portions of integrated circuit die 201, and portions 202 of WLP microelectronic components 100-2 are above and over portions, namely partially overlapping, of integrated circuit die 201 as well as being over and above portions, namely partially overlapping, of each of WLP microelectronic components 100-1. Along those lines, about 20 to 35 percent of the surface area of each WLP microelectronic component 100 may overlap integrated circuit die 201, and about 18 to 33 percent of the surface area of each WLP microelectronic component 100-1 may overlap integrated a pair of WLP microelectronic components 100-2.

WLP microelectronic components 100-1 may be spaced apart from one another with respect to facing inner edges to provide a gap 206. Likewise, WLP microelectronic components 100-2 may be spaced apart from one another with respect to facing inner edges to provide a gap 207. Size of gaps 206 and 207 may impact overall surface area to be provided by upper surface 209, namely may impact size of package substrate 210. Moreover, size of gaps 206 and 207 may affect area of a fan-out region 203, where such fan-out region 203 may have outer boundaries generally corresponding to outer edges of WLP microelectronic components 100-1 and 100-2 as generally indicated by arrows 204. Fan-out region 203 may extend inwardly from such outer boundaries to nearest outer edges of outer contacts 12 of integrated circuit die 10, as generally indicated with arrows 204 and box 205. Contacts 122 of WLP microelectronic components 100-1 and 100-2 may be located in fan-out region 203, as described below in additional detail.

Figure 6:
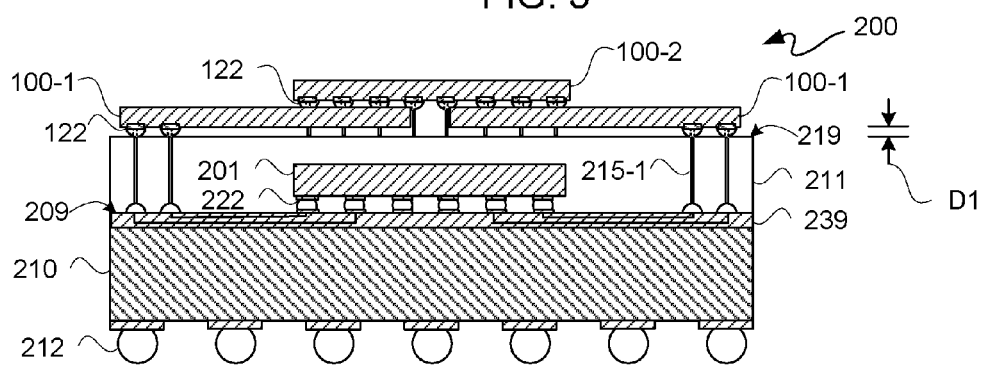
FIG. 6 is a block diagram for a cross-sectional view illustratively depicting an exemplary cross section along B1-B2 of the PoP device of FIG. 5 after adding a molding layer, wire bond wires, and WLP microelectronic components, among other items.
Figure 7:
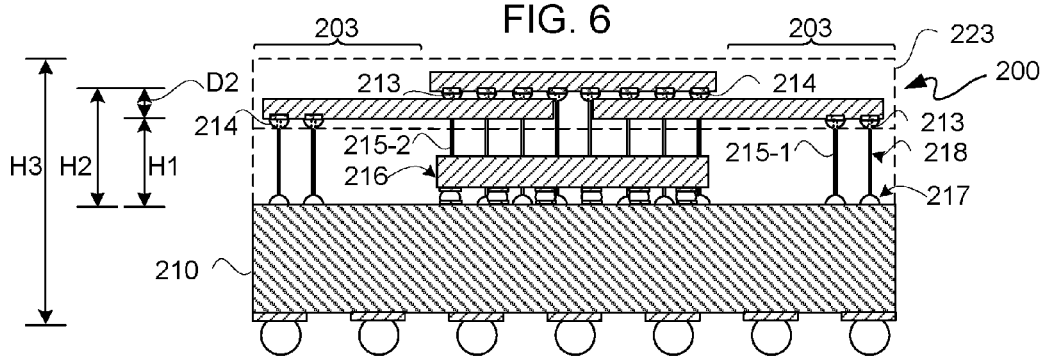
FIG. 7 is a block diagram for the cross-sectional view of FIG. 6 though with a molding layer removed.

FIG. 6 is a block diagram for a cross-sectional view illustratively depicting an exemplary cross section along B1-B2 of PoP device 200 of FIG. 5 after adding a molding layer 211, wire bond wires 215, and WLP microelectronic components 100, among other items as described below in additional detail. FIG. 7 is a block diagram for the cross-sectional view of FIG. 6 though with molding layer 211 removed as indicated by dashed lines for purposes of clarity. FIGS. 6 and 7 are further described with simultaneous reference to FIGS. 2-7.

In this example, wire bond wires 215-1 and 215-2 are coupled to upper surface 209 of package substrate 210. For purposes of clarity by way of example and not limitation, it shall be assumed that no intervening layer is present on an upper surface 209 of package substrate 210; however, package substrate 210 may include a fan-out wafer-level redistribution layer 239 in an implementation hereof.

Wire bond wires 215-1, which may be bond via array wire bond wires, extend generally vertically away from upper surface 209 of package substrate 210 to terminate generally at a height H1. Height H1 may terminate a distance D1 at or above an upper surface 219 of molding layer 211. Upper portions of wire bond wires 215-1 may provide approximately 0 to 50 microns of a distance D1 extension above upper surface 219 of molding layer 211.

Wire bond wires 215-2, which may be bond via array wire bond wires, extend generally vertically away from upper surface 209 of package substrate 210 to terminate generally at a height H2, where height H2 is greater than height H1. Wire bond wires 215-1 and 215-2 are located in a fan-out region 203.

A molding layer 211 may be formed over upper surface 209 of package substrate 210, around sidewall surfaces 216 of integrated circuit die 201, and around bases 217 and shafts 218 of wire bond wires 215-1 and 215-2. In this example, wire bond wires 215-1 and 215-2 are ball bonded to contacts, such as pads (not shown) of upper surface 209. However, in another implementation, stitch bonding or other another bonding may be used.

A left WLP microelectronic component 100-1 and a right WLP microelectronic component 100-1 are located above an upper surface 219 of molding layer 211. WLP microelectronic components 100-1 are respectively flip-chip coupled to a left and a right set of upper portions 213 of wire bond wires 215-1. In this example, solder masses or other eutectic masses 214 may be used for flip-chip coupling upper portions 213 of wire bond wires 215-1 to WLP pad contacts 122 of left and right WLP microelectronic components 100-1.

A left WLP microelectronic component 100-2 and a right WLP microelectronic component 100-2 are located above left and right WLP microelectronic components 100-1. Left and right WLP microelectronic components 100-2 may be respectively flip-chip coupled to a top set and a bottom set (not shown, though the same configuration as the top set in this example) of upper portions 213 of wire bond wires 215-2. In this example, solder masses or other eutectic masses 214 may be used for flip-chip coupling upper portions 213 of wire bond wires 215-2 to WLP pad contacts 122 of left and right WLP microelectronic components 100-2.

Package substrate 210 may be a laminate substrate having at least two layers or a fan-out WLP ("FOWLP") substrate. However, in this implementation, package substrate 210 is a FOWLP RDL. In another implementation, an embedded wafer-level BGA ("eWLB") substrate may be used. Overall stackup height H3 for PoP device 200 may be in a range of approximately 0.5 to 0.8 millimeters after addition of a top molding layer, as generally indicated by dashed line 223. Selection of package substrate 210 can affect overall stackup height H3, for example an FOWLP substrate may be thinner than a laminate substrate.

Package substrate 210 may be a substrate of a reconstituted wafer for wafer-level packaging. While the description herein is for a PoP device using WLP for a memory system-in-package ("SiP"), such as a memory system formed of a memory controller die for integrated circuit die 201 and memory array dies provided with WLP microelectronic components 100, other types of WLPSiPs may be implemented using integrated circuit die 201 as an application specific die and WLP microelectronic components 100 as supporting components of such application specific die. Moreover, even though in this example implementation WLP microelectronic components 100 are all of a same type of memory die, such as for example either all DRAM or all flash memories, in another implementation a combination of different types of dies may be used for WLP microelectronic components 100. For example, uppermost dies may be DRAMs and lower dies below such uppermost dies may be flash memories. Moreover, not all of the dies used to provide WLP microelectronic components 100 need to be memory dies, as other types of dies may be used. Moreover, if through die vias, such as TSVs are used in lower dies of WLP microelectronic components 100, such as flash memory dies, then uppermost dies may obtain signals, power and/or ground through such TSVs, as described below in additional detail. DRAMs conventionally give off more heat than flash memory dies. However, in another implementation, DRAMs may be the lower memory dies, as off-the-shelf DRAMs presently are more likely to have TSVs than flash memory dies. Moreover, even though active dies, such as memory dies for example, are described for WLB microelectronic components 100, in another implementation one or more of upper and/or lower WLP microelectronic components 100 may be passive dies, such as have inductors, capacitors, resistors, and/or other passive circuit elements.

In this example, right and left WLP microelectronic components 100-1 and 100-2 are flip-chip coupled to upper portions 213 of wire bond wires 215-1 and 215-2 with flip-chip ball grid array ("BGA") interconnects using flip-chip contacts 122. Similarly, in this implementation, integrated circuit die 201 is coupled to upper surface 209 with flip-chip BGA interconnects 222. However, in another implementation, integrated circuit die 201 and each of WLP microelectronic components 100 may be coupled to package substrate 210 and wire bond wires 215, respectively, using flip-chip land grid array ("LGA") interconnects for flip-chip coupling. Moreover, in another implementation, a combination of different types of flip-chip coupling, such as one or more types of flip-chip coupling as described herein, may be used.

Using WLP pad contacts 122 for flip-chip BGA coupling allows for a smaller package outline for package substrate 210. Thus, more PoP devices 200 may be formed on a reconstituted wafer. Wire bond wires 215 are located in fan-out region 203, along with contacts 122 of WLP microelectronic components 100. In another implementation, conductive pillars 215 may be used instead of wire bond wires 215. Such conductive pillars 215 may be formed in a known manner by etching or plating. However, in another implementation, through mold vias or the like may be used. However, through mold vias may have a less dense pitch than wire bond wires for example.

While wire bond wires 215 are located in a fan-out region 203, wire bond wires 215-1 and 215-2 may each have a fine pitch in a range of approximately 0.15 to 0.25 millimeters. Generally, for taller bond via array ("BVA") wires, pitch increases. However, BVA wires for wire bond wires 215 may have different heights for WLP three-dimensional ("3D") die stacking, as described herein. In this example implementation, wire bond wires 215-2 may be taller than wire bond wires 215-1 by a difference D2 in height in a range of approximately 50 to 75 microns. This difference D2 in height may be used for coupling a first set and a second set of upper portions 213 of wire bond wires 215-2 respectively to undersides of left WLP microelectronic component 100-2 and right WLP microelectronic component 100-2.

Figure 8:
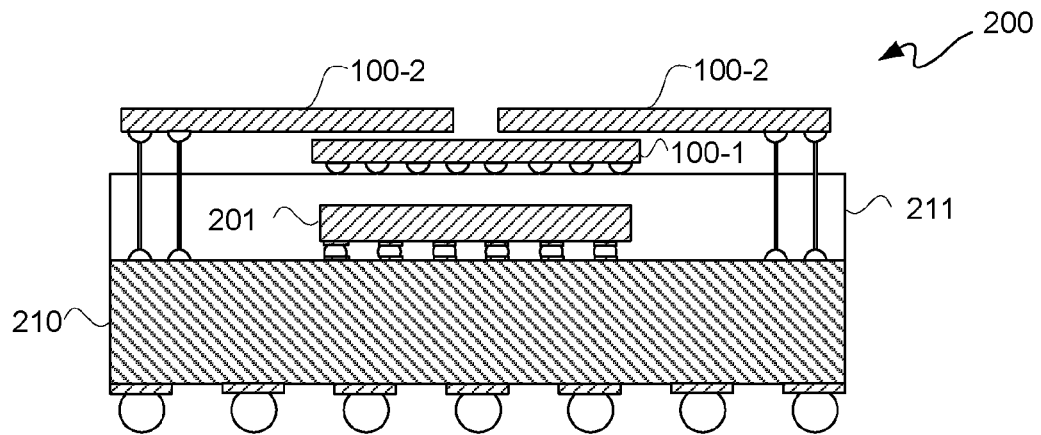
FIG. 8 is a block diagram for a cross-sectional view illustratively depicting an exemplary cross section along C1-C2 of the PoP device of FIG. 5 after adding a molding layer, wire bond wires, and WLP microelectronic components, among other items.
Figure 9A:
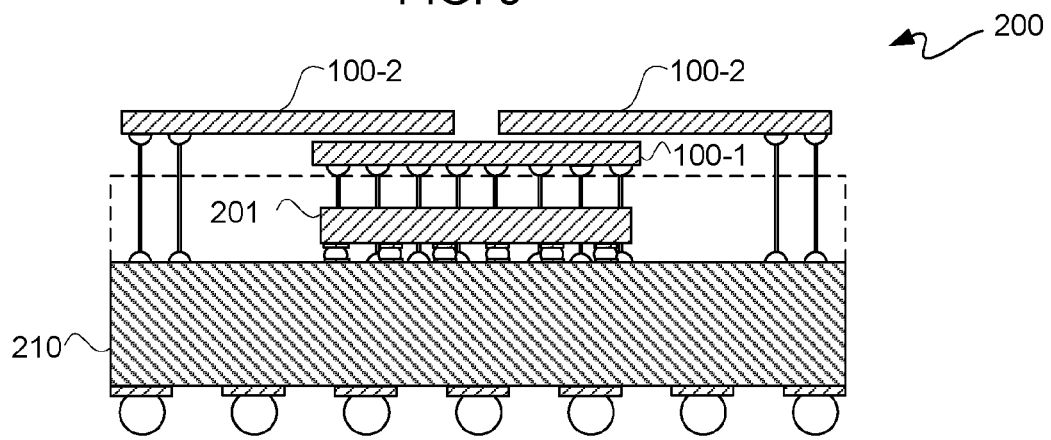
FIG. 9A is a block diagram for the cross-sectional view of FIG. 8 though with a molding layer.
Figure 9B:
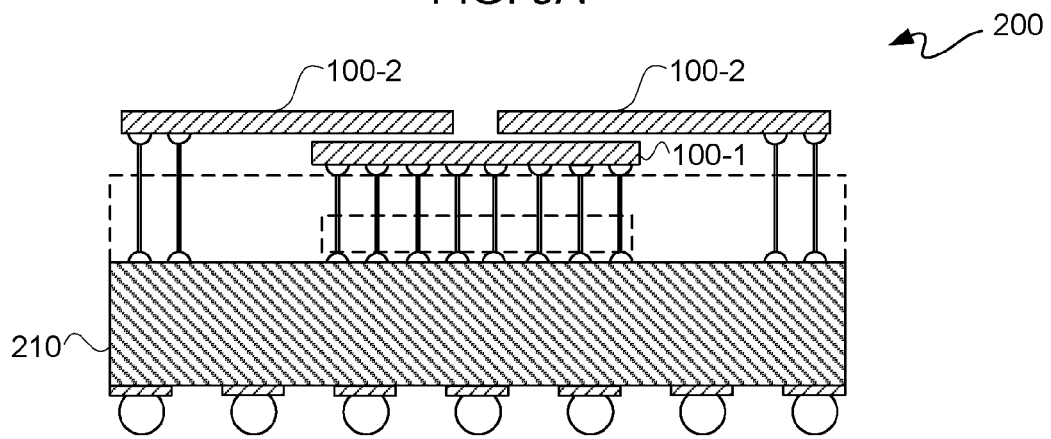
FIG. 9B is a block diagram for the cross-sectional view of FIG. 8 though with a molding layer and an integrated circuit die, as well as pads and other contact components therefor, removed.

FIG. 8 is a block diagram for a cross-sectional view illustratively depicting an exemplary cross section along C1-C2 of PoP device 200 of FIG. 5 after adding a molding layer 211, wire bond wires 215, and WLP microelectronic components 100, among other items as already described above in additional detail. FIG. 9A is a block diagram for the cross-sectional view of FIG. 8 though with molding layer 211 removed as indicated by dashed lines for purposes of clarity, FIG. 9B is a block diagram for the cross-sectional view of FIG. 8 though with molding layer 211 and integrated circuit die 201, as well as pads and other contact components therefor, removed as indicated by dashed lines for purposes of clarity. FIGS. 8, 9A and 9B are not further described below to avoid repetition for purposes of clarity and not limitation.

Figure 10:
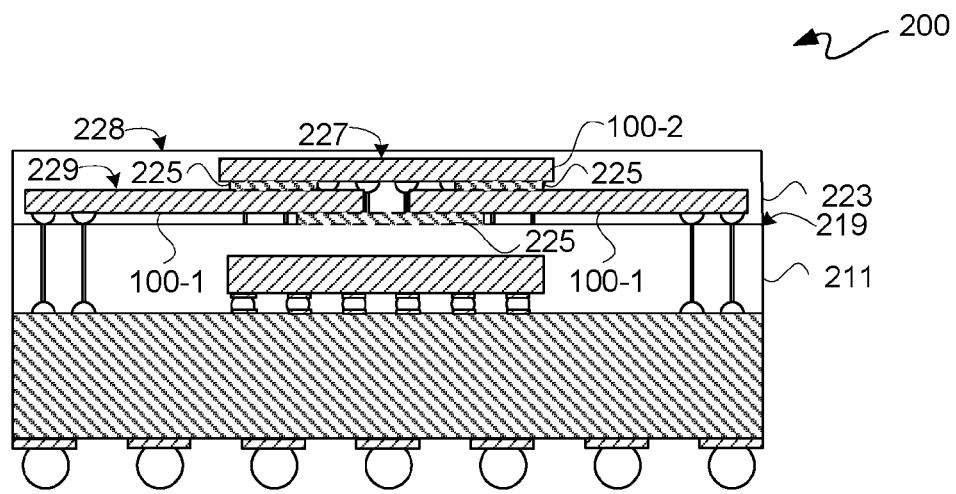
FIGS. 10 and 11 are block diagrams of respective cross-sectional views illustratively depicting exemplary cross sections along B1-B2 of the PoP device of FIG. 5 after adding a molding layer and an optional molding assist film or adhesive layers.
Figure 11:
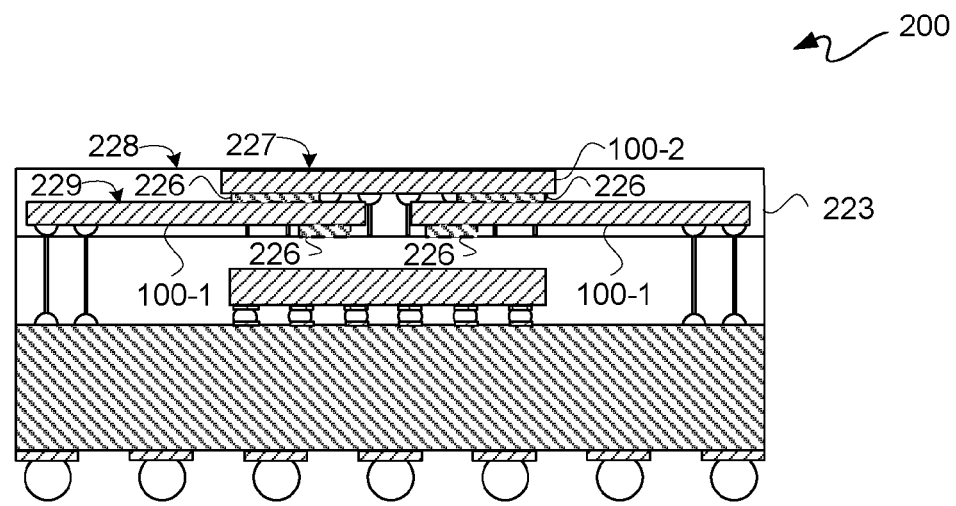
Figure 12:
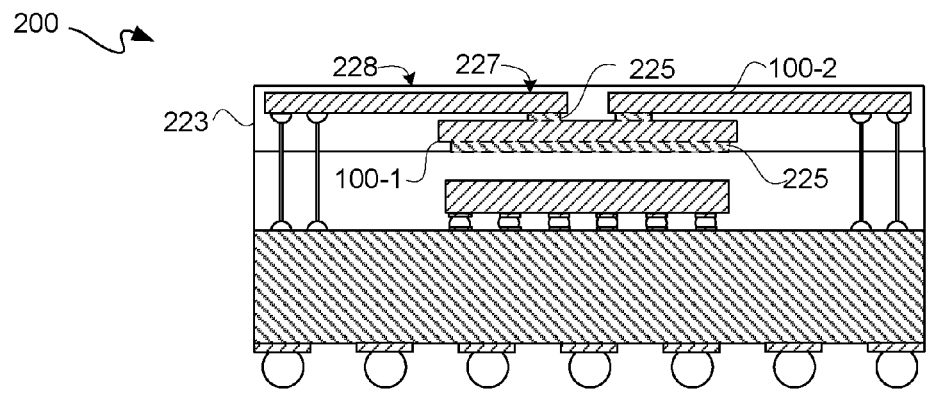
FIGS. 12 and 13 are block diagrams for respective cross-sectional views illustratively depicting exemplary cross sections along C1-C2 of the PoP device of FIG. 5 after adding a molding layer and optional molding assist film or adhesive layers.
Figure 13:
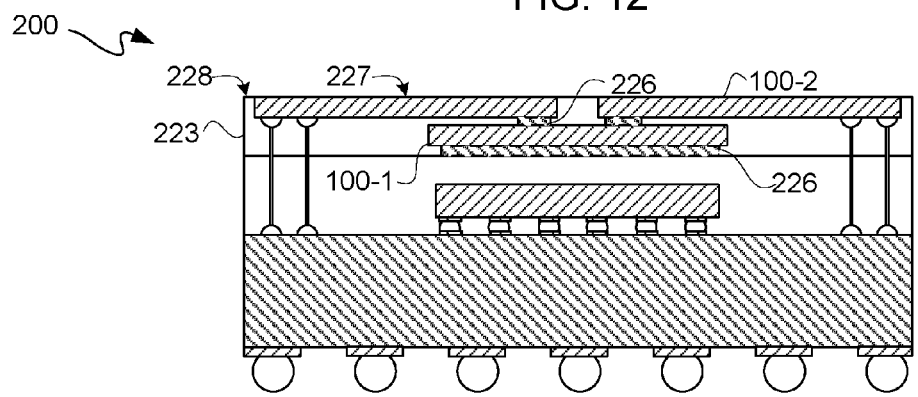

FIGS. 10 and 11 are block diagrams of respective cross-sectional views illustratively depicting exemplary cross sections along B1-B2 of PoP device 200 of FIG. 5 after adding a molding layer 223 and optional molding assist film or adhesive layers 225 and 226. FIGS. 12 and 13 are block diagrams for respective cross-sectional views illustratively depicting exemplary cross sections along C1-C2 of PoP device 200 of FIG. 5 after adding a molding layer 223 and optional molding assist film or adhesive layers 225 and 226. With simultaneous reference to FIGS. 2-13, PoP device 200 of FIGS. 10-13 is further described.

A molding layer 223 may be formed over molding layer 211 for covering each of WLP microelectronic components 100-1 and 100-2. An upper surface 228 of molding layer 223 may be formed above and over upper surfaces 227 of WLP microelectronic components 100-2. Optionally, an upper surface 228 of molding layer 223 may be formed to be generally at a same level with upper surfaces 227 of WLP microelectronic components 100-2, thus providing exposed upper surfaces 227.

Portions of WLP microelectronic components 100-1 may left unsupported in a cantilevered state until supported by addition of molding layer 223. Likewise, portions of WLP microelectronic components 100-2 may left unsupported in a cantilevered state until supported by addition of molding layer 223. However, to provide additional stability and support prior addition of molding layer 223, one or more layers of one or more of optional molding assist film layers 225 or one or more adhesive layers 226 may be added prior to addition of molding layer 223.

Along those lines, an optional mold assist film layer 225 may be added so as to be between an upper surface 219 of molding layer 211 and lower surfaces of WLP microelectronic components 100-1. In another implementation, an optional adhesive layer 225 may be added so as to be between an upper surface 219 of molding layer 211 and lower surfaces of WLP microelectronic components 100-1.

An optional mold assist film layer 225 may be added so as to be between upper surfaces 229 of WLP microelectronic components 100-1 and lower surfaces of WLP microelectronic components 100-2. In another implementation, an optional adhesive layer 225 may be added so as to be between upper surfaces 229 of WLP microelectronic components 100-1 and lower surfaces of WLP microelectronic components 100-2. In still yet other implementations, combinations of one or more layers of one or more of optional molding assist film or adhesive layers 225 and 226 may be added prior to addition of molding layer 223.

Figure 14:
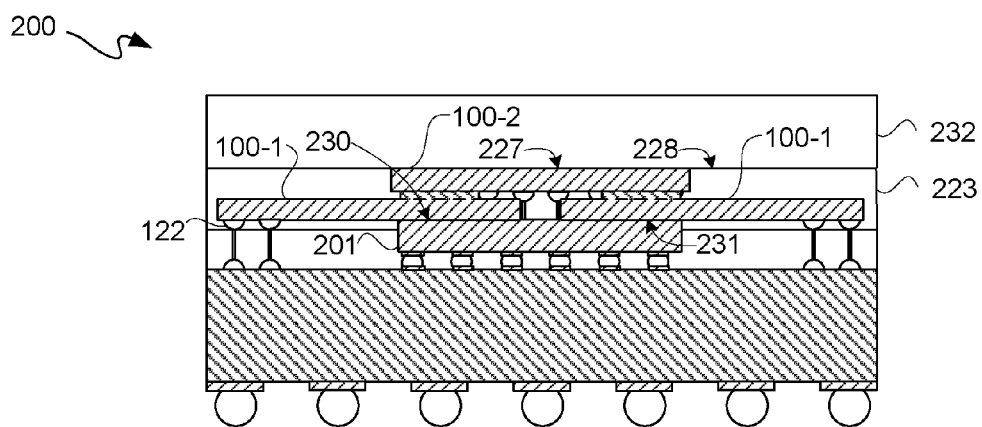
FIG. 14 is a block diagram of a cross-sectional view illustratively depicting an exemplary cross section along B1-B2 of the PoP device 200 of FIG. 5 after adding a molding layer.

FIG. 14 is a block diagram of a cross-sectional view illustratively depicting an exemplary cross section along B1-B2 of PoP device 200 of FIG. 5 after adding a molding layer 223. In this implementation, portions of surface areas of lower surfaces 231 of WLP microelectronic components 100-1 are in contact with portions of surface areas of upper surface 230 of integrated circuit die 201. Thus, an intervening molding assist file or adhesive layer 225 or 226 between such surfaces 230 and 231 may be omitted. Moreover, optionally an upper surface 228 of molding layer 223 may be formed to be generally at a same level with upper surfaces 227 of WLP microelectronic components 100-2, thus providing exposed upper surfaces 227. Along those lines, lapping, polishing or other material removal may be used to level tops of solder balls of contacts 122 to upper surface 230.

For low power memory dies of WLP microelectronic components 100, less heat may be generated by operation of such devices allowing for a more low profile PoP device 200. Optionally, a heat sink 232 may be coupled to upper surfaces 227, as well as upper surface 228, for removal of heat from PoP device 200. In this example implementation, four memory dies respectively of WLP microelectronic components 100 may be in communication with a memory controller integrated circuit die 201 during operation.

Figure 15:
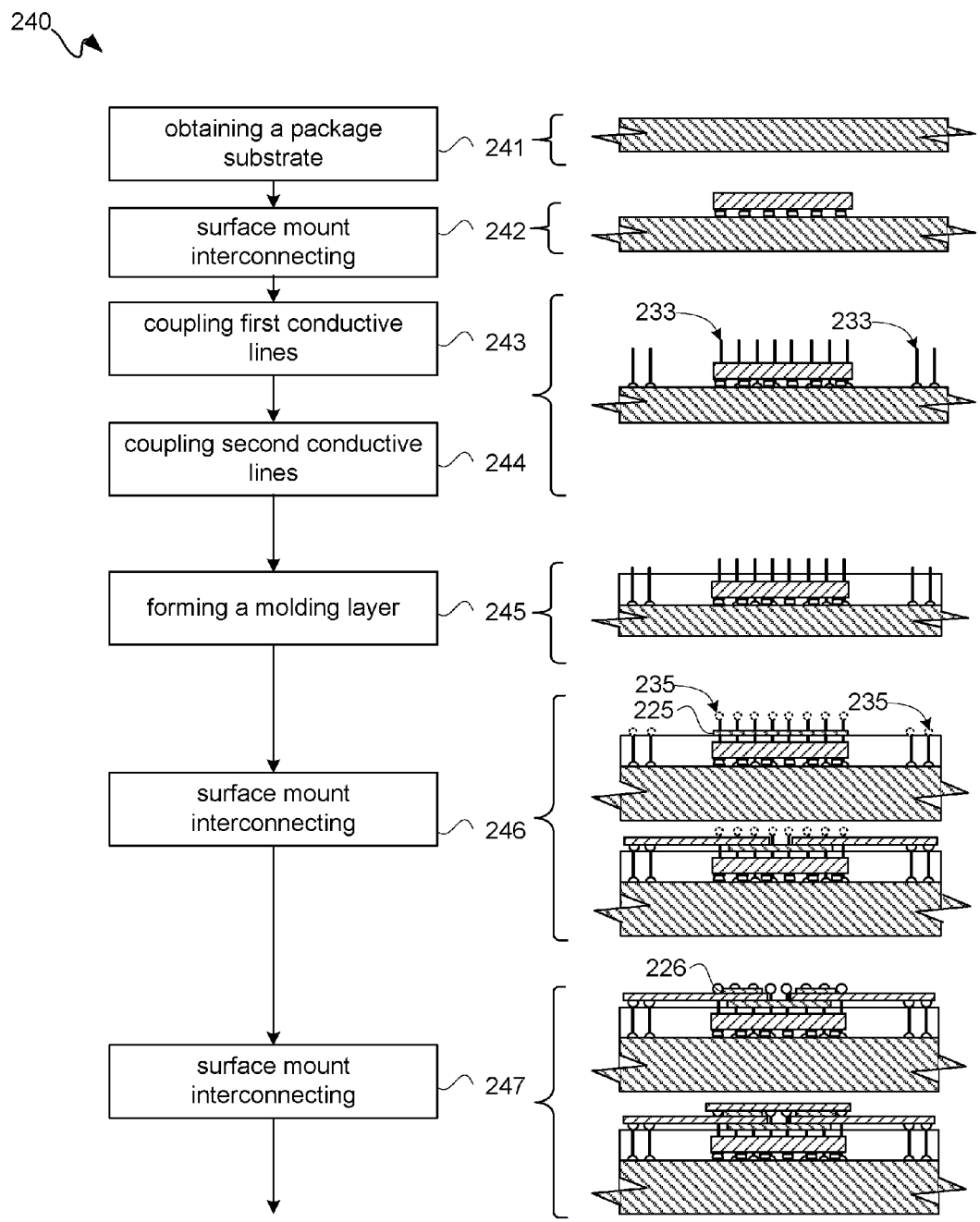
FIG. 15 is a flow diagram with corresponding cross-sectional views illustratively depicting an exemplary process flow for forming a PoP device.
Figure 15:
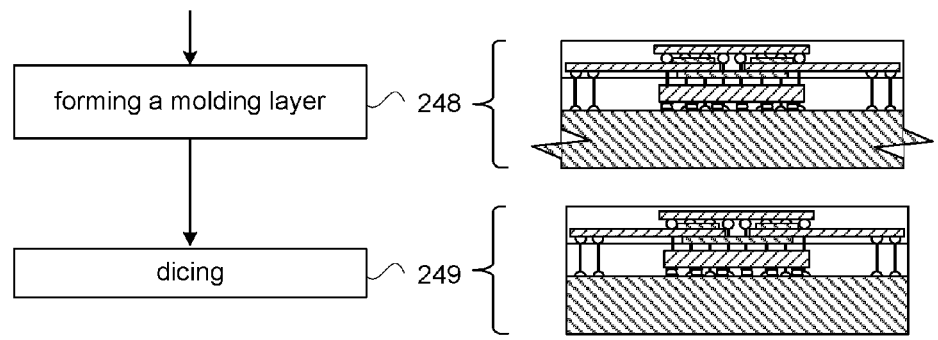

FIG. 15 is a flow diagram with corresponding cross-sectional views illustratively depicting an exemplary process flow 240 for forming a PoP device 200. FIG. 15 is further described with simultaneous reference to FIGS. 1 through 15.

At 241, a package substrate 210 is obtained. At 242, an integrated circuit die 201 may be surface mount coupled or interconnected, such as flip-chip coupled or interconnected, to an upper surface 209 of package substrate 210.

At 243, conductive lines or wires 215, such as wire bond wires 215-1 for example, may be coupled, such as ball bonded or otherwise attached for example, to upper surface 209, including contacts thereof such as of a fan-out redistribution layer 239, of package substrate 210. Again, wire bond wires 215-1 may extend away from upper surface 209 of package substrate 210 to terminate at generally a first height. In another implementation, plated or etched conductive pillars 215-1, such as copper pillars for example, may be formed along upper surface 209 of package substrate 210 and may extend away from upper surface 209 of package substrate 210 to terminate at generally a first height. In yet another implementation, conductive vias 215-1 may be used.

At 244, conductive lines or wires 215, such as wire bond wires 215-2 for example, may be coupled, such as ball bonded or otherwise attached for example, to upper surface 209, including contacts thereof such as of a fan-out redistribution layer 239, of package substrate 210. Again, wire bond wires 215-2 may extend away from upper surface 209 of package substrate 210 to terminate at generally a second height greater than first height. In another implementation, plated or etched conductive pillars 215-2, such as copper pillars for example, may be formed along upper surface 209 of package substrate 210 and may extend away from upper surface 209 of package substrate 210 to terminate at generally a second height greater than such a first height. Again, wire bond wires, or conductive pillars, 215-1 and 215-2 may be located in a fan-out region 203. In yet another implementation, conductive vias 215-1 may be used.

Figures 16, 17:
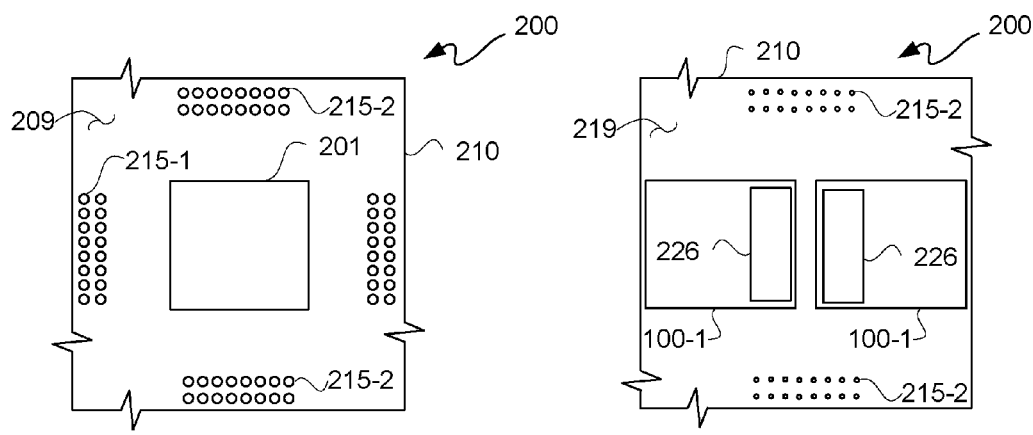
FIG. 16 is a block diagram of a top-down view illustratively depicting an exemplary layout of the PoP device of FIG. 5 after operations of the process flow of FIG. 5.
FIG. 17 is a block diagram of a top-down view illustratively depicting an exemplary layout of the PoP device of FIG. 5 after more operations of the process flow of FIG. 5.

FIG. 16 is a block diagram of a top-down view illustratively depicting an exemplary layout of PoP device 200 of FIG. 5 after operations 241 through 244. Along those lines, conductive lines or wires 215, such as wire bond wires 215-1 for example, may be attached right and left and wire bond wires 215-2 may be attached top and bottom of a generally centrally located integrated circuit die 201, all of which are coupled to upper surface 209 of package substrate 210.

Tips of conductive lines or wires 215, such as wire bond wires 215-1 and 215-2 for example, may be generally straight tips 233 for accepting solder or other eutectic masses. For an implementation with conductive pillars or vias 215-1 and 215-2, namely replacing wire bond wires with conductive pillars or vias, tips 233 of upper portions 213 of conductive pillars or vies 215-1 and 215-2 may provide bond pad-like surfaces. Again, for purposes of clarity by way of example and not limitation, wire bond wires 215-1 and 215-2 are generally described below even though in another implementation conductive pillars or vias may be used instead of wire bond wires 215-1 and 215-2.

At 245, a molding layer 211 may be formed over upper surface 209 of package substrate 210, around sidewall surfaces of integrated circuit die 201, and around bases and shafts of wire bond wires 215-1 and 215-2. A mold and reveal of tips 233 of upper portions 213 may be used for forming molding layer 211. Optionally, an exposed die mold may be used for forming molding layer 211. Optionally, a mold over wire bond wires 215-1 and 215-2 and a ground, polish or etch back to reveal tips 233 wire bond wires 215-1 and 215-2 may be used.

At 246, surface mount interconnecting, such as flip-chip interconnecting, of WLP microelectronic components 100-1 above an upper surface 219 of molding layer 211 may be performed. This flip-chip interconnecting may include coupling a first and a second set of upper portions 213 of wire bond wires 215-1 respectively to WLP microelectronic components 100-1. Optionally, flip-chip interconnection at 246 may include forming masses of solder paste 235 on tips 233 of wire bond wires 215-1 and optionally of wire bond wires 215-2. Furthermore, optionally flip-chip interconnecting at 246 may include putting down an optional molding assist film layer 225 on upper surface 219 prior to coupling WLP microelectronic components 100-1, so such optional molding assist film layer 225 may be under portions of undersides of WLP microelectronic components 100-1 for support thereof.

FIG. 17 is a block diagram of a top-down view illustratively depicting an exemplary layout of PoP device 200 of FIG. 5 after operations 241 through 246. Along those lines, upper surfaces 229 of WLP microelectronic components 100-1 may be exposed along with tips of wire bond wires 215-2, where such tips may extend above an upper surface 219 of a molding layer 211. An optional adhesive layer 226, which in this example is two strips, may be placed on upper surfaces 229 of WLP microelectronic components 100-1, as described below in additional detail.

At 247, surface mount interconnecting, such as flip-chip interconnecting for example, of WLP microelectronic components 100-2 above WLP microelectronic components 100-1. This flip-chip interconnecting may include coupling a first and a second set of upper portions 213 of wire bond wires 215-2 respectively to WLP microelectronic components 100-2. Optionally, flip-chip interconnection at 247 may include forming masses of solder paste 235 on tips 233 of wire bond wires 215-2, if not already done at 247. Furthermore, optionally flip-chip interconnecting at 247 may include putting down an optional adhesive layer 226 on upper surface portions of WLP microelectronic components 100-1 prior to coupling WLP microelectronic components 100-2, so such optional adhesive layer 225 may be under portions of undersides of WLP microelectronic components 100-2 for support thereof.

Figure 18:
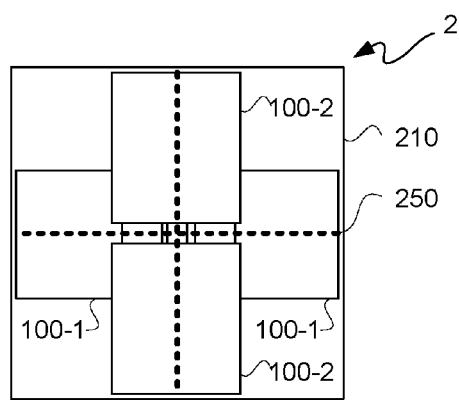
FIG. 18 is a block diagram of a top-down view illustratively depicting an exemplary layout of the PoP device of FIG. 5 after yet more operations of the process flow of FIG. 5.

FIG. 18 is a block diagram of a top-down view illustratively depicting an exemplary layout of PoP device 200 of FIG. 5 after operations 241 through 247. Along those lines, WLP microelectronic components 100-1 and 100-2 may be positioned relative to one another to form a cross-pattern, as generally indicated with dashed cross 250.

At 248, a molding layer 223 may be formed over molding layer 211 for covering each of WLP microelectronic components 100-1 and 100-2. At 249, PoP device 200 may be diced from a reconstituted wafer. Though in another implementation, PoP device 200 may be assembled as a single component.

Figure 19:
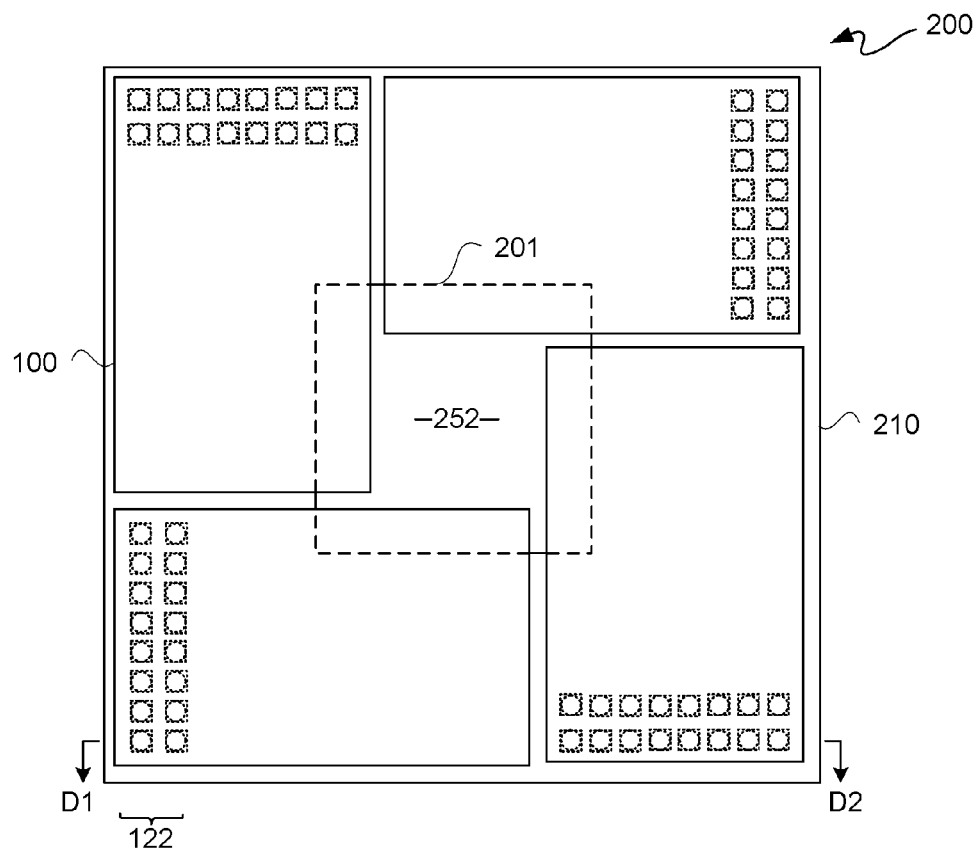
FIG. 19 is a block diagram of a top-down view illustratively depicting an exemplary layout of a PoP device for a same level of WLP microelectronic components.
Figure 20:
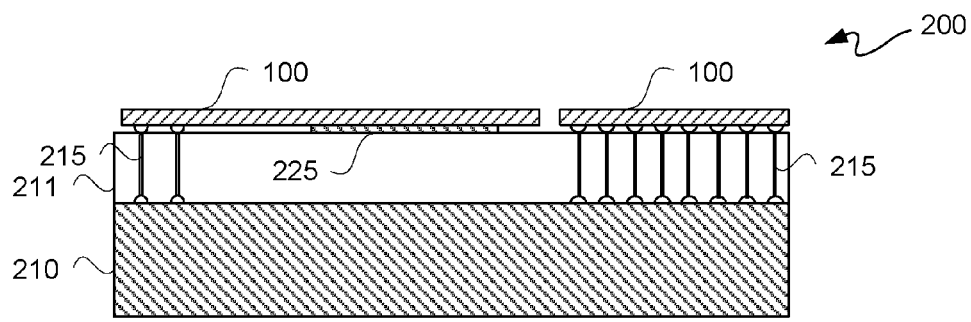
FIG. 20 is a block diagram of a cross-sectional view illustratively depicting an exemplary cross section along D1-D2 of the PoP device of FIG. 19.

FIG. 19 is a block diagram of a top-down view illustratively depicting an exemplary layout of PoP device 200 for a same level of WLP microelectronic components 100. By "same level", it is generally meant that WLP microelectronic components 100 and/or IC dies 10 are coupled to a same upper surface, such as an upper surface of molding layer 211 with surface mount contacts 122 for example, as previously described. FIG. 20 is a block diagram of a cross-sectional view illustratively depicting an exemplary cross section along D1-D2 of PoP device 200 of FIG. 19. With simultaneous reference to FIGS. 19 and 20, PoP device 200 illustratively depicted in those figures is further described.

A package substrate 210 has a first integrated circuit die 201 surface mount coupled to an upper surface of package substrate 201, as previously described. Conductive lines 215, such as wire bond wires, conductive pillars, and/or conductive vias, are coupled to such upper surface of package substrate 210 in a fan-out region with respect to integrated circuit die 201, as previously described. Conductive lines 215 extend away from such upper surface of package substrate 210.

A molding layer 211 may be formed over the upper surface of package substrate 210, around sidewall surfaces of integrated circuit die 201, and around bases and shafts of conductive lines 215. WLP microelectronic components 100 may be located at a same level above an upper surface of molding layer 211 respectively surface mount coupled to sets of upper portions of conductive lines 215.

Again, integrated circuit die 201 may be a controller die; and each of WLP microelectronic components 100 may include a respective memory die. An overall package height of PoP device 200 may be in a range of approximately to millimeters.

WLP microelectronic components 100 may be laid out to form a quadrangle-like shape defining central region 252 in a center thereof. Contacts 122 may be in rows or columns ("rows").ABs of contacts 122 of nearest neighbors of WLP components 100 may be orthogonal to one another. Rows of contacts 122 may be located proximate to an outer perimeter of package substrate 210.

Figure 21:
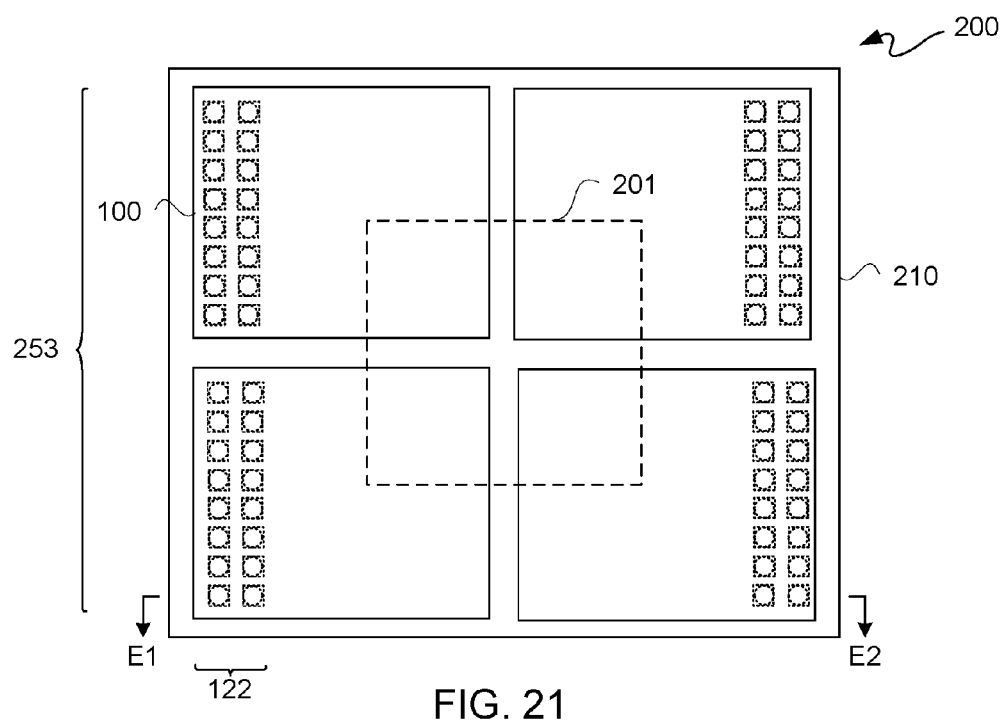
FIG. 21 is a block diagram of a top-down view illustratively depicting an exemplary layout of another PoP device for a same level of WLP microelectronic components.
Figure 22:
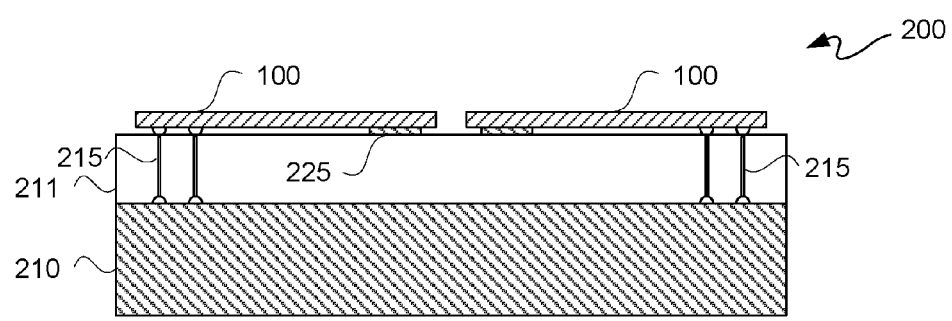
FIG. 22 is a block diagram of a cross-sectional view illustratively depicting an exemplary cross section along E1-E2 of the PoP device of FIG. 21.

FIG. 21 is a block diagram of a top-down view illustratively depicting an exemplary layout of PoP device 200 for a same level of WLP microelectronic components 100. FIG. 22 is a block diagram of a cross-sectional view illustratively depicting an exemplary cross section along E1-E2 of PoP device 200 of FIG. 21. With simultaneous reference to FIGS. 21 and 22, PoP device 200 illustratively depicted in those figures is further described. As much of the description of FIGS. 21 and 22 is the same as the description of FIGS. 19 and 20, such same description is not repeated for purposes of clarity and not limitation.

In PoP device 200, WLP microelectronic components 100 are laid out to form a quadrilateral-like shape. Contacts 122 are in rows or columns ("rows"). Rows of contacts of a first two of WLP components 100 on a left side are parallel with one another to form left-side extended rows 253. Rows of contacts 122 of a second two of WLP components 100 on a right side are parallel with one another to form right-side extended rows 253. These left- and right-side extended rows 253 of contacts 122 may be opposite of one another. Both sets of such extended rows 253 may be located proximate to an outer perimeter of package substrate 210, and both sets of such extended rows 253 of contacts 122 may be parallel to one another.

Figure 23:
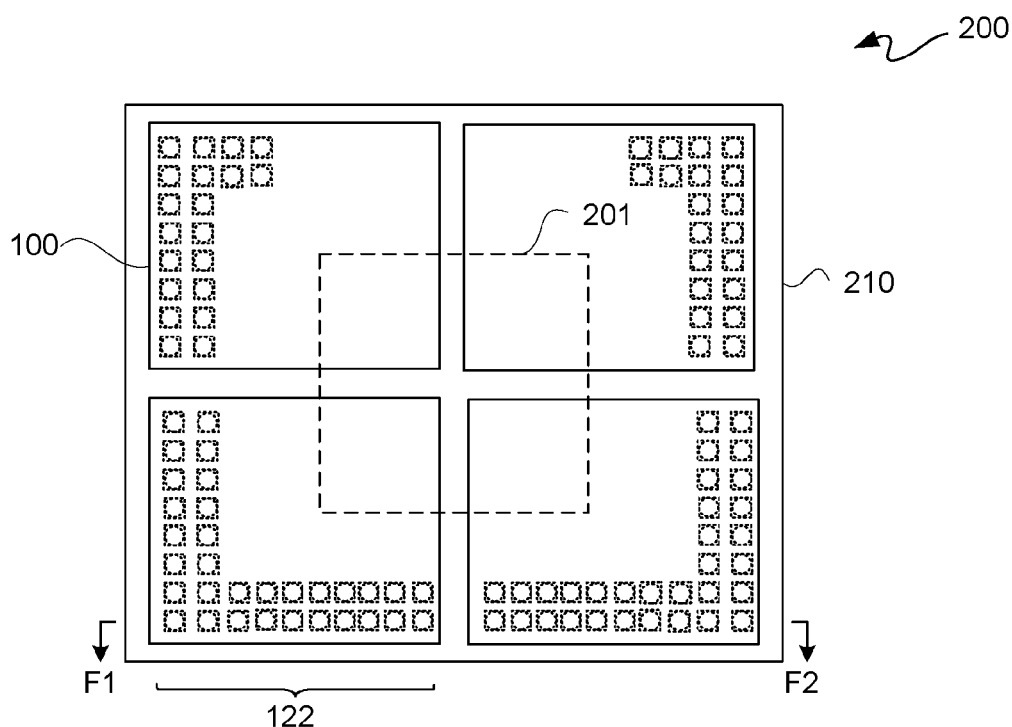
FIG. 23 is a block diagram of a top-down view illustratively depicting an exemplary layout of yet another PoP device for a same level of WLP microelectronic components.
Figure 24:
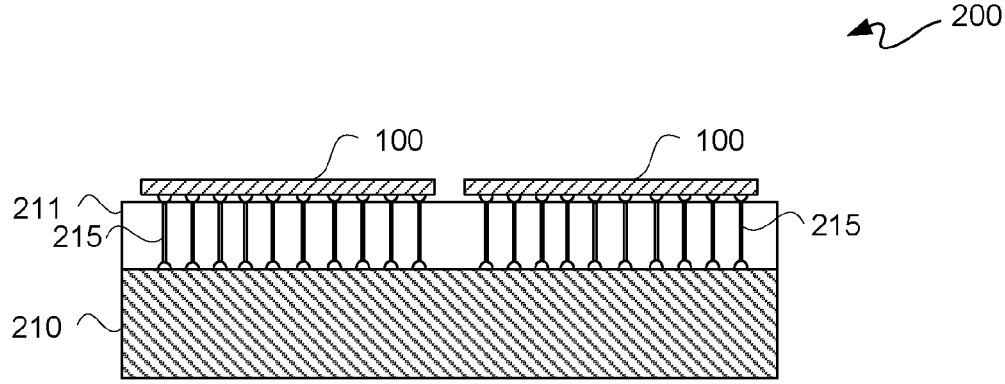
FIG. 24 is a block diagram of a cross-sectional view illustratively depicting an exemplary cross section along F1-F2 of the PoP device of FIG. 23.

FIG. 23 is a block diagram of a top-down view illustratively depicting an exemplary layout of PoP device 200 for a same level of WLP microelectronic components 100. FIG. 24 is a block diagram of a cross-sectional view illustratively depicting an exemplary cross section along F1-F2 of PoP device 200 of FIG. 23. With simultaneous reference to FIGS. 23 and 24, PoP device 200 illustratively depicted in those figures is further described. As much of the description of FIGS. 23 and 24 is the same as the description of FIGS. 21 and 22, such same description is not repeated for purposes of clarity and not limitation.

In this PoP device 200, row or columns of contacts 122 form an "L-like" shape. Accordingly, contacts 122 may be disposed along one or more edges proximate to a perimeter of a WLP component 100. Moreover, while all of contacts 122 may be in a fan-out region with respect to integrated circuit die 201, a set of contacts 122 of a WLP component 100 may be in a fan-out region with respect to an IC die 10 of such a WLP component 100, and another set of contacts 122 of such a WLP component 100 may be in a fan-in region, namely a middle or inner third region 14, with respect to such an IC die 10 of such a WLP component 100.

Figure 25:
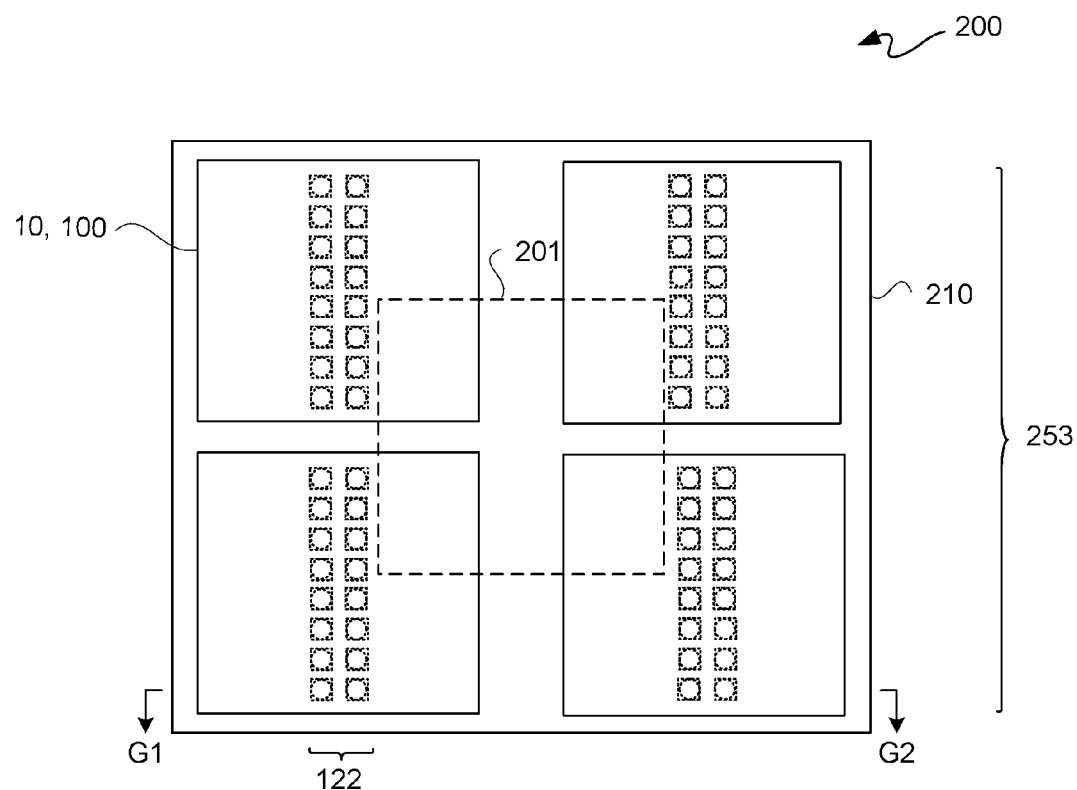
FIG. 25 is a block diagram of a top-down view illustratively depicting an exemplary layout of a PoP device for a same level of WLP microelectronic components and/or bare IC dies 10.
Figure 26:
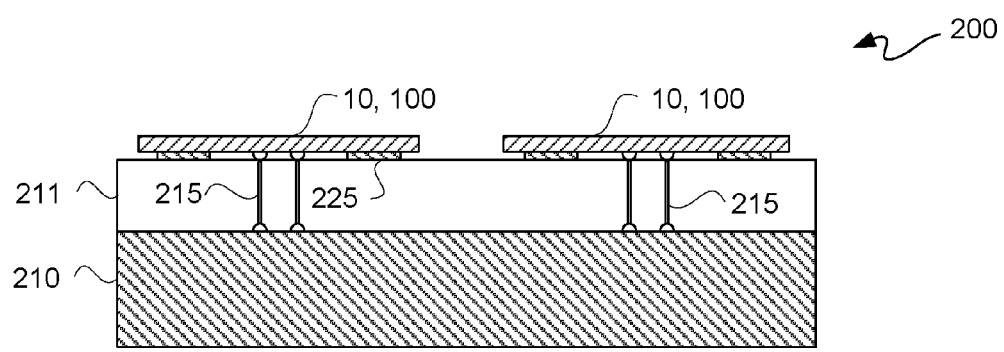
FIG. 26 is a block diagram of a cross-sectional view illustratively depicting an exemplary cross section along G1-G2 of the PoP device of FIG. 25.

FIG. 25 is a block diagram of a top-down view illustratively depicting an exemplary layout of PoP device 200 for a same level of WLP microelectronic components 100 and/or bare IC dies 10. FIG. 26 is a block diagram of a cross-sectional view illustratively depicting an exemplary cross section along G1-G2 of PoP device 200 of FIG. 25.

With simultaneous reference to FIGS. 25 and 26, PoP device 200 illustratively depicted in those figures is further described. As much of the description of FIGS. 25 and 26 is the same as the description of FIGS. 21 and 22, such same description is not repeated for purposes of clarity and not limitation.

In this PoP device 200, IC dies 10 of WLP components 100 and/or bare IC dies 10 have contacts 122 in an inner third region 14 of a front side surface of such IC dies. WLP microelectronic components 100 and/or bare IC dies 10 may be laid out to form a quadrilateral-like shape. Again, rows of contacts 122 may form left- and right-side extended rows 253 though along middle third regions 14, and such left- and right-side extended rows 253 may be opposite and parallel with one another.

Figure 27A:
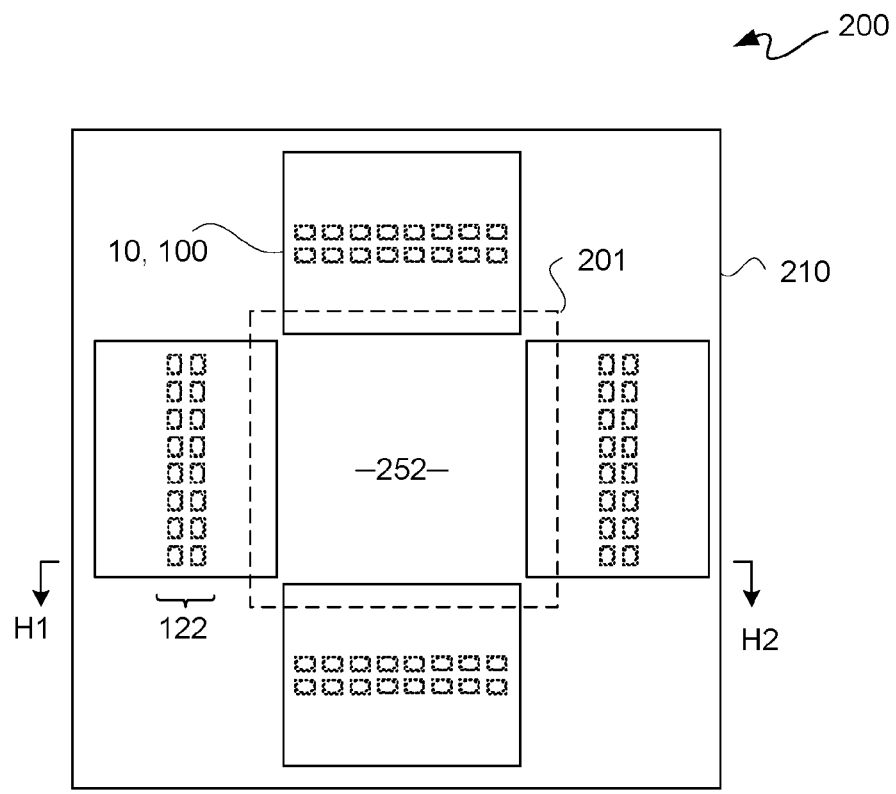
FIGS. 27A-27C are respective block diagrams of top-down views illustratively depicting exemplary layouts of PoP and/or dies-on-package devices for a same level of WLP microelectronic components and/or bare IC dies.
Figure 28A:
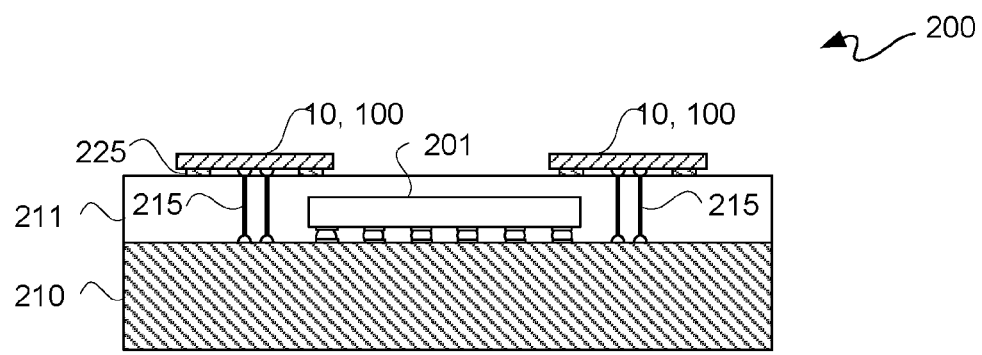
FIGS. 28A-28C are respective block diagrams of cross-sectional views illustratively depicting exemplary cross sections along H1-H2 of the PoP and/or dies-on-package devices of FIGS. 27A-27C, respectively.
Figure 27B:
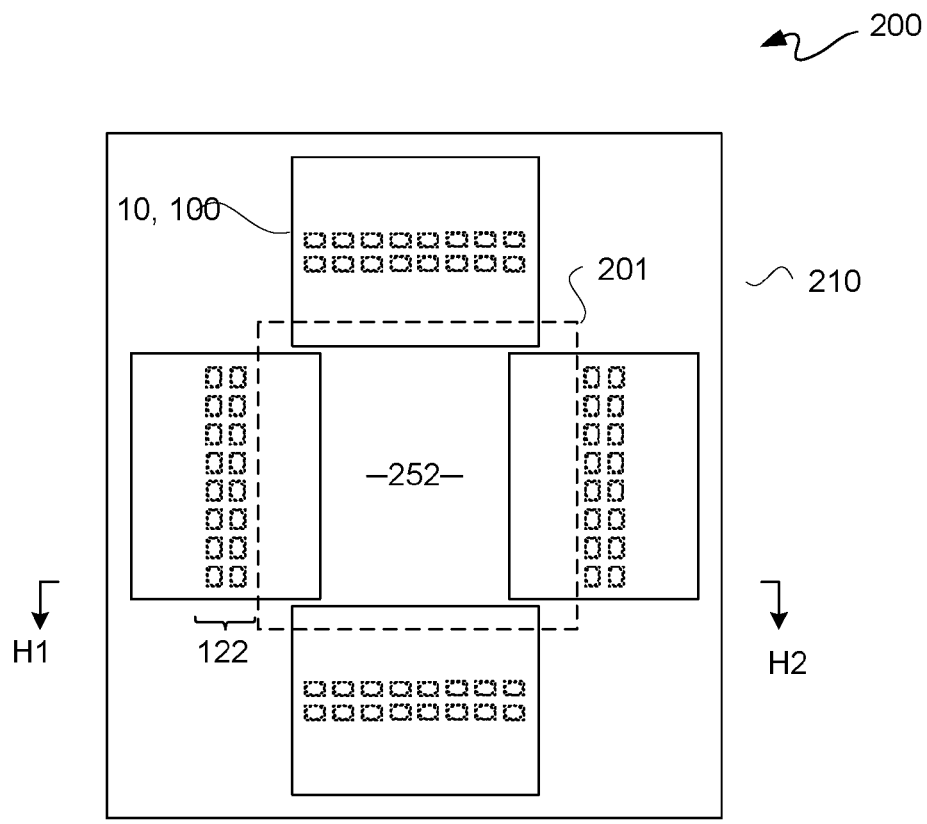
Figure 28B:
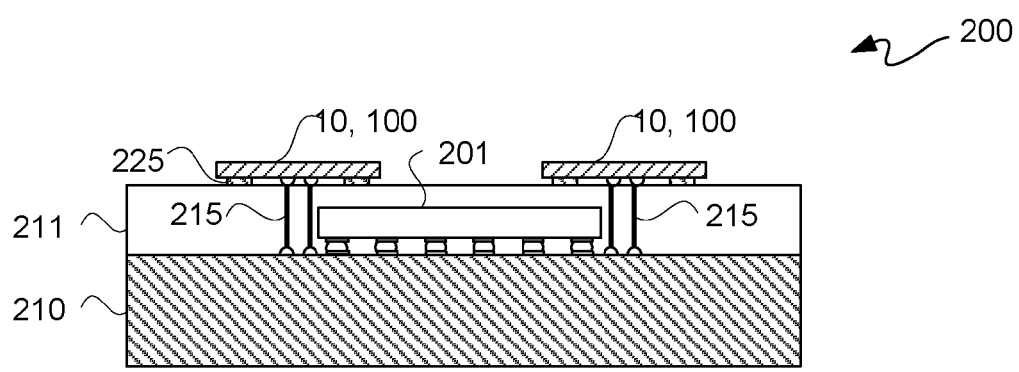
Figure 27C:
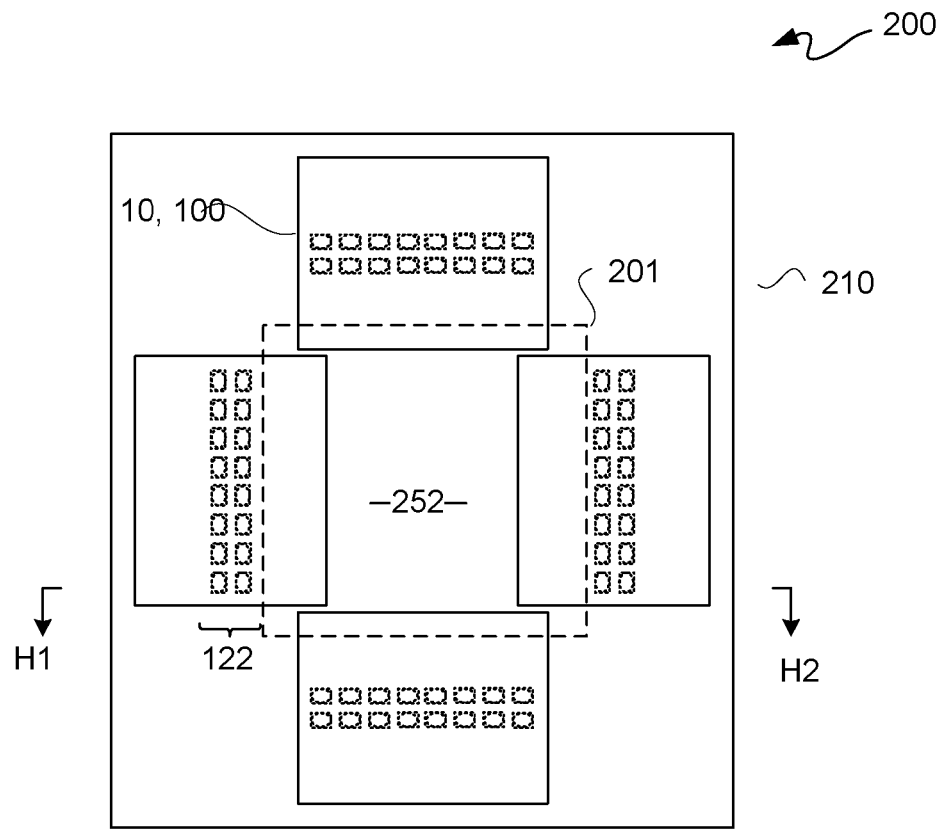
Figure 28C:
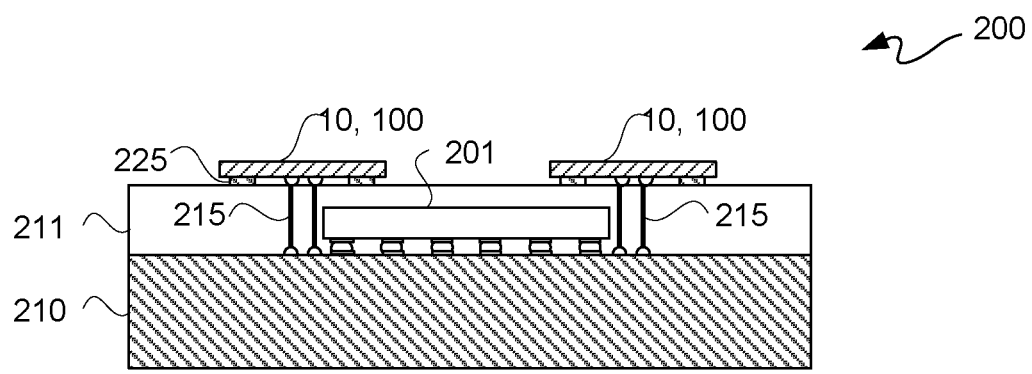

FIGS. 27A-27C are respective block diagrams of top-down views illustratively depicting exemplary layouts of PoP and/or dies-on-package devices 200 for a same level of WLP microelectronic components 100 and/or bare IC dies 10. FIGS. 28A-28C are respective block diagrams of cross-sectional views illustratively depicting exemplary cross sections along H1-H2 of PoP and/or dies-on-package devices 200 of FIGS. 27A-27C, respectively. With simultaneous reference to FIGS. 27A-27C and 28A-28C, PoP devices 200 illustratively depicted in those figures are further described. As much of the description of FIGS. 27A-27C and 28A-28C is the same as the description of FIGS. 21-26, such same description is not repeated for purposes of clarity and not limitation.

In these devices 200, IC dies 10 of WLP components 100 and/or bare IC dies 10 have contacts 122 in an inner third region of a front side surface of such IC dies. WLP microelectronic components 100 and/or bare IC dies 10 may be laid out to form a cross-like quadrilateral shape with a central region 252. WLP components 100 and/or bare IC dies 10 may be surface mount interconnected to conductive lines 215. Conductive lines 215, such as wire bond wires, conductive pillars, and/or conductive vias, may be coupled to an upper surface of a package substrate 210 in a fan-out region with respect to integrated circuit die 201. Conductive lines 215 may extend away from such upper surface of package substrate 210 to go above an upper surface of molding layer 211.

Along those lines, rows or columns ("rows") of contacts 122 may be left- and right-side rows for a pair or two of opposite WLP microelectronic components 100 and/or bare IC dies 10 spaced on opposite sides of central region 252, with such rows along middle third regions 14 of such WLP microelectronic components 100 and/or bare IC dies 10. Such left- and right-side rows may be opposite and parallel with one another.

Likewise, rows of contacts 122 may be top- and bottom-side rows for another pair or two of opposite WLP microelectronic components 100 and/or bare IC dies 10 spaced on opposite sides of central region 252, with such rows along middle third regions 14 of such WLP microelectronic components 100 and/or bare IC dies 10. Such top- and bottom-side rows may be opposite and parallel with one another. Columns of left- and right-side WLP microelectronic components 100 and/or bare IC dies 10 may be orthogonal to rows of top- and bottom-side WLP microelectronic components 100 and/or bare IC dies 10.

Surface area portions of WLP microelectronic components 100 and/or bare IC dies 10 may each partially overlap integrated circuit die 201. These overlapping surface area portions may be generally uniform amounts of overlap for all of such WLP microelectronic components 100 and/or bare IC dies 10 in an implementation of PoP device 200. However, in another implementation of PoP device 200, right- and left-side or top- and bottom-side WLP microelectronic components 100 and/or bare IC dies 10 may have a larger partial overlap than top- and bottom-side or right- and left-side WLP microelectronic components 100 and/or bare IC dies 10, respectively.

Figure 29:
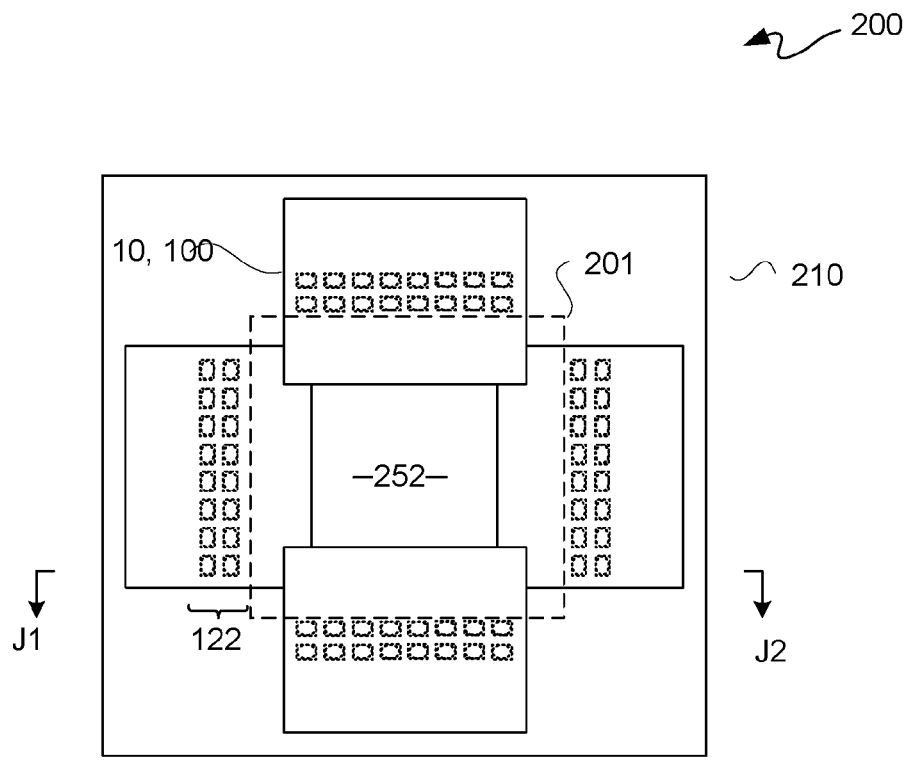
FIG. 29 is a block diagram of a top-down view illustratively depicting an exemplary layout of a PoP device for a multi-level of WLP microelectronic components and/or bare IC dies.
Figure 30:
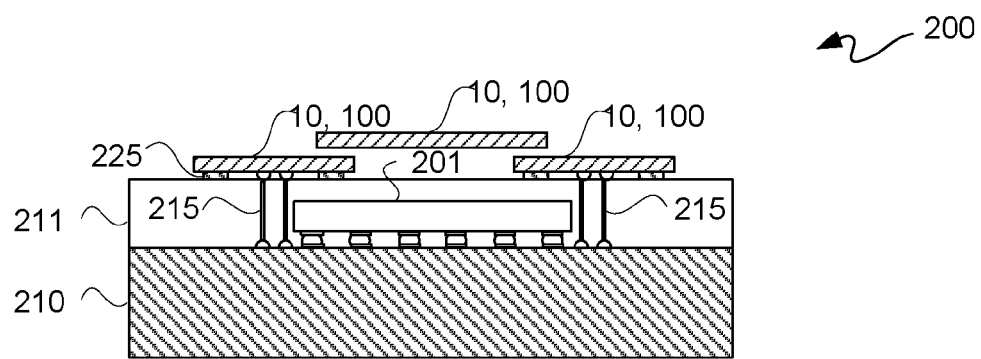
FIG. 30 is a block diagram of a cross-sectional view illustratively depicting an exemplary cross section along J1-J2 of the PoP device of FIG. 29.

FIG. 29 is a block diagram of a top-down view illustratively depicting an exemplary layout of PoP device 200 for multi-level of WLP microelectronic components 100 and/or bare IC dies 10. FIG. 30 is a block diagram of a cross-sectional view illustratively depicting an exemplary cross section along J1-J2 of PoP device 200 of FIG. 29. With simultaneous reference to FIGS. 29 and 30, PoP device 200 illustratively depicted in those figures is further described. As much of the description of FIGS. 29 and 30 is the same as the description of FIGS. 21-28C, such same description is not repeated for purposes of clarity and not limitation.

A first pair or two of WLP microelectronic components 100 and/or bare IC dies 10 may be positioned at a same level for coupling to an upper surface, such as an upper surface of molding layer 211, and a second pair or two of WLP microelectronic components 100 and/or bare IC dies 10 may be positioned at a same level, such as on tips of conductive lines 215 for being above such first pair of WLP microelectronic components 100 and/or bare IC dies 10. This may allow for a more compact surface area though in exchange for a taller profile in comparison to all WLP microelectronic components 100 and/or bare IC dies 10 being at a same level. Surface area portions of each of WLP microelectronic components 100 and/or bare IC dies 10 respectively overlap portions of integrated circuit die 201, and surface are portions of an upper or second pair or two of WLP microelectronic components 100 and/or bare IC dies 10 may overlap portions of each of integrated circuit die 201 and a lower or first pair or two of WLP microelectronic components 100 and/or bare IC dies 10.

With reference to FIGS. 25-30, while all of contacts 122 may be in a fan-out region with respect to integrated circuit die 201, a set of contacts 122 of a WLP component 100 and/or IC die 10 may be in a fan-out region, such as an outer third region 13 or 15, with respect to an IC die 10 of such a WLP component 100 and/or such IC die 10, and another set of contacts 122 of such a WLP component 100 and/or IC die 10 may be in a fan-in region, namely a middle third region 14, with respect to such an IC die 10 of such a WLP component 100 and/or such IC die 10.

Planar profiles of WLP component 100 and/or such IC die 10, as well as integrated circuit die 201, may be a polygon, such as a rectangle or a square for example. With respect to rectangular or other polygon shapes having one or more sides longer than one or more other sides, such longer or shorter sides may be aligned with edges or sides of integrated circuit die 201 with or without partial overlap of surface area portions of integrated circuit die 201.

Figure 31:
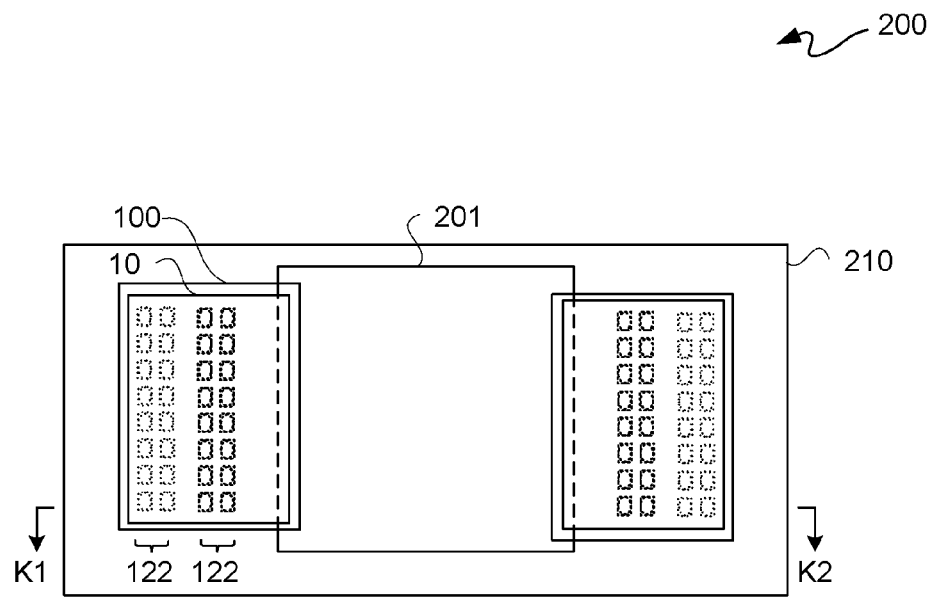
FIG. 31 is a block diagram of a top-down view illustratively depicting an exemplary layout of a PoP device for a multi-level of WLP microelectronic components and bare IC dies.
Figure 32A:
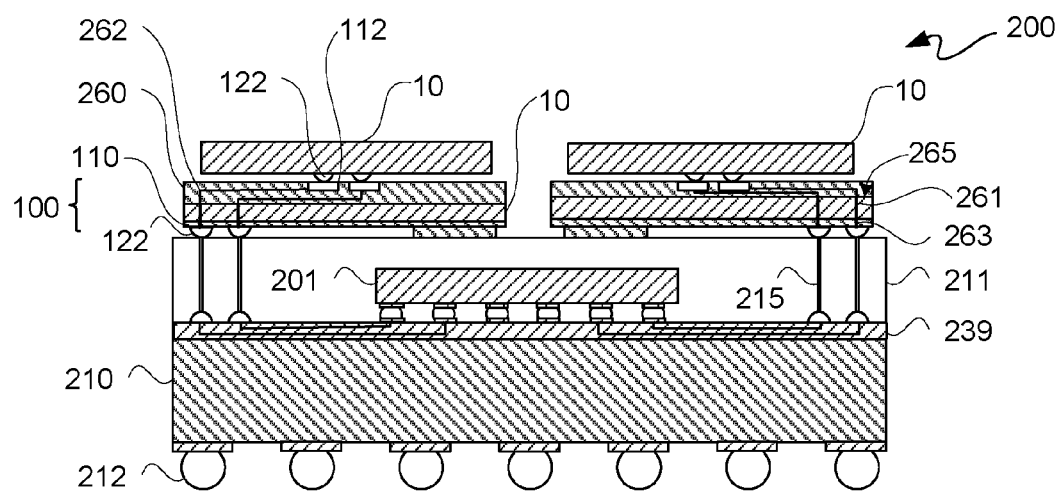
FIGS. 32A and 32B are respective block diagrams of cross-sectional views illustratively depicting exemplary cross sections along K1-K2 of the PoP device of FIG. 31 and a reverse orientation of stacks thereof, respectively.
Figure 32B:
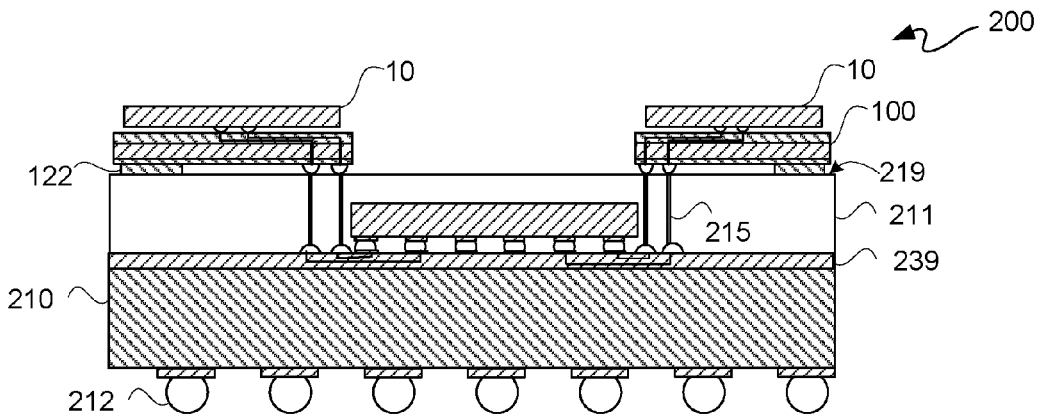

FIG. 31 is a block diagram of a top-down view illustratively depicting an exemplary layout of PoP device 200 for multi-level of WLP microelectronic components 100 and bare IC dies 10. FIGS. 32A and 32B are respective block diagrams of cross-sectional views illustratively depicting exemplary cross sections along K1-K2 of PoP device 200 of FIG. 31 and a reverse orientation stacks thereof, respectively. With simultaneous reference to FIGS. 31, 32A and 32B, PoP device 200 illustratively depicted in those figures is further described. As much of the description of FIGS. 31, 32A and 32B is the same as the description of FIGS. 5-30, such same description is not repeated for purposes of clarity and not limitation.

Integrated circuit die 201 may be surface mount coupled to an upper surface of package substrate 210, with conductive lines 215 coupled to an upper surface of package substrate 210 in a fan-out region with respect to integrated circuit die 201. Conductive lines 215 may extending away from such upper surface of package substrate 210, including at or above an upper surface of molding layer 211, for surface mount coupling to WLP microelectronic component 100 located at a same level above such upper surface of molding layer 211 respectively coupled to sets of upper portions of conductive lines 215. Again, each of such WLP microelectronic components 100 may have an IC die 10; however, in this implementation, such WLP microelectronic components 100 have at least one IC die 10 located between a lower redistribution layer 110 and an upper redistribution layer 260. Moreover, in this implementation such at least one IC die 10 of each such WLP microelectronic component 100 includes through die vias 261, such as TSVs 261 for example. TSVs 261 as well as lower surface mount contacts 122 may correspond to some of conductive lines 215, and such corresponding conductive lines 215 and TSVs 216 may be located in a fan-out region with reference to integrated circuit die 201. A pair or two bare IC dies may be respectively surface mount coupled over upper redistribution layers 260 of WLP microelectronic components 100 with upper surface mount contacts 122.

Each of WLP packaged microelectronic components 100 may include such IC die 10 with contacts in an inner third region 14 of a front surface thereof. A lower redistribution layer 110 may have inner contacts 112 in an inner third region 14 of an upper surface thereof and have outer contacts 122 in an outer third region 13 or 15 of a lower surface thereof opposite such upper surface, such as previously described.

Lower outer contacts 122, which are offset from upper inner contacts 112, positioned in a fan-out region as previously described, may be surface mount contacts for interconnecting with TSVs 261, as well as being coupled to contacts 12 of a lower IC die 10 through traces 114 and upper inner contacts 112. Though a same number for upper and lower IC dies 10 is used, such upper and lower IC dies 10 may be the same or different. For example, either or both of such IC dies 10 may be DRAM or flash memory dies.

Upper redistribution layer 260 may have contacts 112 in an inner third region 14 of an upper surface thereof and interconnects 262 in an outer third region 13 or 15 of a lower surface thereof opposite such upper surface. TSVs 261 in an outer third region 13 or 15 of an upper surface and an opposite lower surface of a lower IC die 10 sandwiched between redistribution layers 110 and 260 may be coupled to some of lower contacts 122 and interconnects 262. Thus, a portion or set of lower contacts 122 may be for coupling to a lower IC die 10, and another portion or set of lower contacts 122 may be for coupling to an upper IC die 10.

Interconnects 262 of redistribution layer 260 may be coupled for electrical conductivity to TSVs 261 of lower IC die 10 with an upper or backside surface of such lower IC die 10 face-to-face with a lower surface of redistribution layer 260. Interconnects 262 may be offset from upper contacts 122 of redistribution layer 260 for being positioned in a fan-out region for association at least with an outer third region 13 or 15 of surfaces of each of redistribution layers 110 and 260, as well as that of an IC die 10 therebetween.

Each of upper IC dies 10 may include upper surface mount contacts 122 in an inner third region 14 of respective surfaces of such dies. Contacts 122 of redistribution layer 260 for each microelectronic component 100 may be coupled for electrical conductivity respectively to contacts 122 of upper right and left IC dies 10. Front surfaces of upper IC dies 10 may be face-to-face with upper surfaces of redistribution layers 260 of WLP microelectronic components 100, respectively.

Again, conductive lines 215 may be wire bond wires, conductive pillars and/or conductive vias. Moreover, package substrate 210 may include a fan-out WLP redistribution layer 239. Again, integrated circuit die 201 may be a logic and/or processor die, such as a controller die or other die, and IC dies 10 may be any of a variety of different types of passive or active dies, or combinations thereof, including without limitation memory dies.

FIG. 32B is the same as FIG. 32A, except orientation of WLP microelectronic components 100, as well as that of corresponding interconnect structures, such as conductive lines 215 for example, is rotated 180 degrees or flipped from an outer fan-out orientation to an inner fan-out orientation. Along those lines, conductive lines 215 of FIG. 32B may be closer to integrated circuit die 201 than in FIG. 32A to reduce propagation delay, as traces in fan-out redistribution layer 239 may be shorter in FIG. 32B than in FIG. 32A.

Conductive lines or wires 215, as well as TSVs 261, are in a fan-out region with respect to integrated circuit die 201, as well as upper and lower IC dies 10. However, upper IC dies 10 are coupled in a fan-in region with respect to upper redistribution layer 260, namely bare upper IC dies 10 may use middle third upper contacts 122 directly coupled to contacts 112 of redistribution layer 260.

With reference to FIG. 31, lower or left rows or columns of contacts 122 are in a fan-out region, while upper or right rows or columns of contacts 122 are in a fan-in region with respect to a middle third region 14 of lower and upper IC dies 10, respectively. Either or both of upper or lower IC dies 10 may be die stacks.

Figure 33:
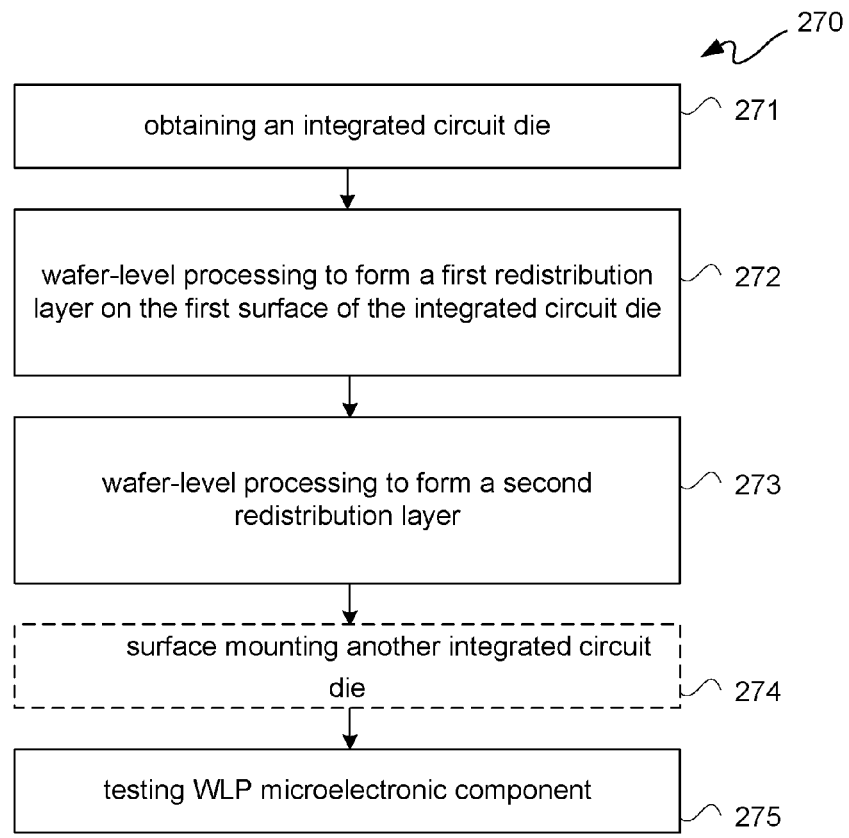
FIG. 33 is a flow diagram illustratively depicting an exemplary process flow for forming the WLP microelectronic component of FIG. 32A or 32B.

FIG. 33 is a flow diagram illustratively depicting an exemplary process flow 270 for forming a WLP microelectronic component 100 of FIG. 32A or 32B. With simultaneous reference to FIGS. 2-33, process flow 270 is further described.

At 271, obtained is an integrated circuit die 10. Integrated circuit die 10 has contacts 12 in an inner third region 14 of a surface 11 of integrated circuit die 10 and has through die vias 261 in an outer third region 13 or 15. At 272, integrated circuit die 10 is wafer-level processed to form a redistribution layer 110 on surface 11 of integrated circuit die 10.

Redistribution layer 110 may be formed to have contacts 112 in an inner third region 14 of a surface 111 of redistribution layer 110 interconnected to contacts 12 of integrated circuit die 10 with surface 11 of integrated circuit die 10 face-to-face with surface 111 of redistribution layer 110. Redistribution layer 110 may be formed to have interconnects 263 in an outer third region 13, or 15, of a surface 111 of redistribution layer 110 interconnected to through die vias 261 of integrated circuit die 10 with surface 11 of integrated circuit die 10 face-to-face with surface 111 of redistribution layer 110.

Respective sets of contacts 122 in an outer third region 13, or 15, of a surface 113 of redistribution layer 110 opposite surface 111 thereof may be coupled for electrical conductivity to contacts 112 and interconnects 263. For purposes of clarity and not limitation, interconnects 263 may be considered part of lower contacts 122.

Lower contacts 122 are offset from contacts 112 for being positioned in a fan-out interconnect region for association at least with outer third region 13, or 15, of surface 111 of redistribution layer 110. Contacts 122 are surface mount contacts, such as flip-chip contacts for example.

In this implementation, contacts 12 and 112 may correspond to one another, and inner third region 14 of each of surfaces 11 and 111 may correspond to one another. In this implementation, only contacts 122 may be externally available for interconnection on surface 113 of redistribution layer 110.

At 273, wafer-level processing may be used to form a redistribution layer 260 on a back side surface 265 of a wafer in which IC die 10 is located. Through die vias 261 may extend from front side surface 11 to an opposite back side surface 265 of IC die 10. Interconnects 262, as well as traces, may be formed in redistribution layer 260 for electrical conductivity with through die vias 261, and for electrical coupling of through die vias 261 in an outer third region 13, or 15, to contacts 112 in a middle third region 14 on an opposite surface of redistribution layer 260 from interconnection with an IC die 10 of WLP component 100. A back side surface of IC die 10 may be face-to-face with a lower side surface of redistribution layer 260 for interconnection of through die vias 261 with interconnects 262, and an upper surface of redistribution layer 260 may have surface mount contacts, such as pads, 112 for subsequent interconnection with another IC die 10.

Optionally, at 274, another IC die 10 may be obtained having surface mount contacts 122 in an inner third region 14 of a front side or lower surface thereof. At 274, such IC die 10 may be surface mounted for having surface mount contacts 112 of redistribution layer 260 coupled for electrical conductivity to contacts 122 of an upper bare IC die 10 with a lower surface of such IC die 10 face-to-face with an upper surface of redistribution layer 260.

At 275, a WLP microelectronic component 100, with or without such upper IC die 10 coupled thereto, may be tested at a wafer-level or after being diced, including without limitation being diced from a semiconductor or other wafer.

Returning to FIG. 15, operations at 241 through 245 may be as previously described for forming a single or same level of WLP microelectronic components and/or IC dies 10. However, for a single or same level of WLP microelectronic components 100 and/or IC dies 10, conductive lines or wires 215 may all terminate at generally a same height, such as to be at or above a level of a molding layer, and so operation 244 may be omitted in such a configuration. However, for a multi-level of WLP microelectronic components 100 and/or IC dies 10, conductive lines or wires 215-1 and 215-2 may be used, and so operation 244 may be used in such a configuration.

Along those lines, conductive lines or wires 215 may be attached right and left and/or top and bottom of a generally centrally located integrated circuit die 201, all of which may be coupled to upper surface 209 of package substrate 210.

At 246, surface mount interconnecting, such as flip-chip interconnecting, of WLP microelectronic components 100 and/or IC dies 10 above an upper surface 219 of molding layer 211 may be performed as previously described. For PoP devices 200 of FIGS. 19-24, this interconnecting for a same level, namely operation 244 is omitted and operation 243 may include additional conductive lines for other fan-out regions with WLP microelectronic components 100. For PoP and dies-on-package devices 200 of FIGS. 25-28C, this interconnecting for a same level, namely operation 244 is omitted and operation 243 may include additional conductive lines for other fan-in regions with respect to WLP microelectronic components 100 and/or IC dies 10. For PoP and dies-on-package devices 200 of FIGS. 25-28C, this interconnecting for a same level, namely operation 244 is omitted and operation 243 may include additional conductive lines for other fan-in regions with respect to WLP microelectronic components 100 and/or IC dies 10. For PoP and dies-on-package devices 200 of FIGS. 29 and 30, this interconnecting is for a multi-level, namely operation 244 is included for fan-in regions with respect to WLP microelectronic components 100 and/or IC dies 10. For PoP and dies-on-package devices 200 of FIGS. 31-32B, this interconnecting is for a first-level, though operation 244 is omitted, where such first level is for fan-out regions with respect to WLP microelectronic components 100.

At 247, surface mount interconnecting, such as flip-chip interconnecting for example, of WLP microelectronic components 100 and/or IC dies 10 may be performed for multi-level configurations as in PoP and dies-on-package devices 200 of FIGS. 29 and 30, though for fan-in regions of WLP microelectronic components 100 and/or IC dies 10. For PoP and dies-on-package devices 200 of FIGS. 31-32B, surface mount interconnecting at 247 may be for WLP microelectronic components 100 and/or IC dies 10 to be surface mounted, such as by flip-chip interconnecting, to contacts 112 of redistribution layer 260.

At 248, a molding layer 223 may be formed over molding layer 211 for covering each of PoP and dies-on-package devices 200. At 249, PoP device and dies-on-package devices 200 may be diced from a reconstituted wafer, if not manufactured as single components.

Figure 34:
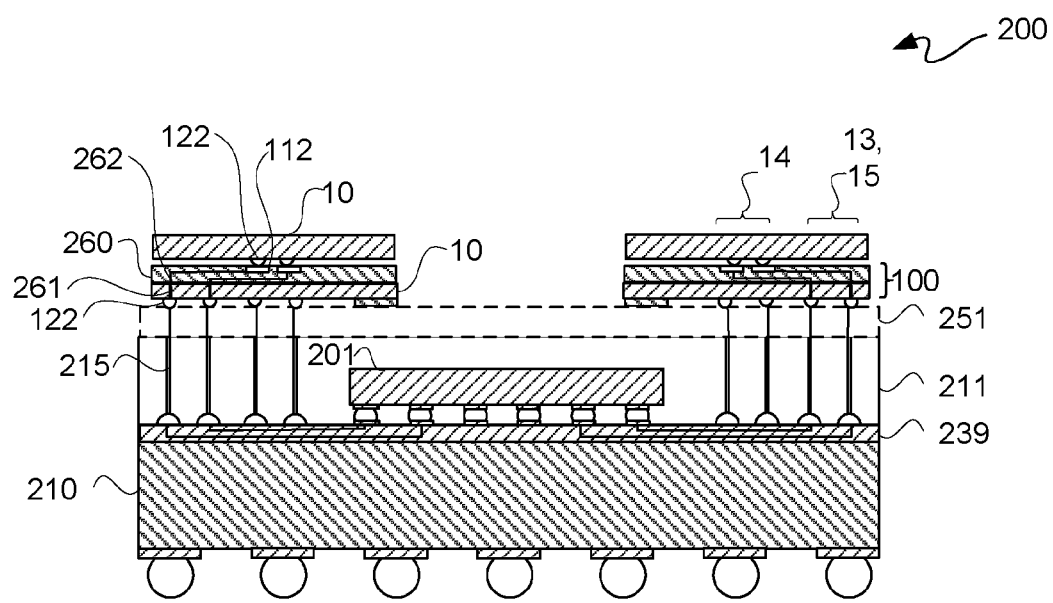
FIG. 34 is a block diagram of a cross-sectional view illustratively depicting an exemplary cross section of another package-on-package device.

FIG. 34 is a block diagram of a cross-sectional view illustratively depicting an exemplary cross section of another package-on-package device 200. As much of the description of FIG. 34 is the same as the description of FIGS. 2-33, such same description is not repeated for purposes of clarity and not limitation.

Integrated circuit die 201 may be surface mount coupled to an upper surface of package substrate 210, with conductive lines 215 coupled to an upper surface of package substrate 210 in a fan-out region with respect to integrated circuit die 201. However, in this implementation, a set of conductive lines 215 are in a fan-in region, namely a middle or inner third region 14, with respect to an IC die 10, and another set of conductive lines 215 are in a fan-out region, namely an outer third region 13 or 15, with respect to such IC die 10.

Conductive lines 215 may extend away from such upper surface of package substrate 210, including at or above an upper surface of molding layer 211, for surface mount coupling to IC dies 10 located at a same level above such upper surface of molding layer 211 and respectively coupled to sets of upper portions of conductive lines 215. IC dies 10 may be coupled to an optional redistribution layer 251 formed on an upper surface of molding layer 211. Formation of optional redistribution layer 251 may be performed at a wafer level.

On each of IC dies 10 upper redistribution layers 260 may respectively be formed. IC dies 10 include through die vias 261, such as TSVs 261 for example. TSVs 261 as well as lower surface mounting contacts 122 may correspond to some of conductive lines 215, and such corresponding conductive lines 215 and TSVs 216 may be located in a fan-out region 13 with reference to integrated circuit die 201 and to corresponding IC dies 10. A pair or two IC dies 10 may be respectively surface mount coupled to optional redistribution layer 251 or conductive lines 215 directly with lower surface mounting contacts 122 for electrically coupling to fan-out contacts 122 and TSVs 261, as well as fan-in contacts 122, of such lower IC dies 10.

Each lower IC die 10 may include contacts 122 in an inner third region and an outer third region of a front surface thereof. Upper redistribution layer 260 may have contacts 112 in an inner third region 14 of an upper surface thereof and interconnects 262 in an outer third region 13 or 15 of a lower surface thereof opposite such upper surface. TSVs 261 in an outer third region of upper surface and opposite lower surface of a lower IC die 10 may be coupled to lower contacts 122 and interconnects 262 in a fan-out region 13 or 15 with respect to IC dies 10. Thus, a portion or set of lower contacts 122 may be for coupling to lower IC die 10, and another portion or set of lower contacts 122 may be for coupling to upper IC die 10 through TSVs 261 of lower IC die 10.

Interconnects 262 of redistribution layer 260 may be coupled for electrical conductivity to TSVs 261 of lower IC die 10 with an upper or backside surface of such lower IC die 10 face-to-face with a lower surface of redistribution layer 260. Interconnects 262 may be offset from upper contacts 112 of redistribution layer 260 for being positioned in a fan-out region with respect to an IC die 10.

Each of upper IC dies 10 may include upper surface mount contacts 122 in an inner third region of respective surfaces of such dies. Contacts 112 of redistribution layers 260 may be coupled for electrical conductivity respectively to contacts 122 of upper right and left IC dies 10. Front surfaces of upper IC dies 10 may be face-to-face with upper surfaces of redistribution layers 260. A lower IC die 10 with a redistribution layer 260 on a backside surface thereof may form WLP microelectronic component 100.

Again, conductive lines 215 may be wire bond wires, conductive pillars and/or conductive vias. Moreover, package substrate 210 may include a fan-out WLP redistribution layer 239. Again, integrated circuit die 201 may be a logic and/or processor die, such as a controller die or other die, and IC dies 10 may be any of a variety of different types of passive or active dies, or combinations thereof.

Upper IC dies 10 may be coupled in a fan-in region 14 to upper redistribution layer 260, namely bare upper IC dies 10 may be used as such middle third upper contacts 122 may be directly coupled to contacts 112 of redistribution layer 260. Either or both of upper or lower IC dies 10 may be die stacks.

Returning to FIG. 33, forming of a WLP microelectronic component 100 for PoP device 200 of FIG. 34 is further described. With simultaneous reference to FIGS. 2-34, process flow 270 is further described.

At 271, obtained are IC dies 10 having contacts 12 in an inner third region 14 of a surface 11 respectively thereof and having through die vias 261 in an outer third region 13 or 15 respectively thereof. Two or a pair of these IC dies 10 may be formed to have contacts 122 corresponding to contact 12 and through die vias 261 along a front face surface thereof, where contacts 122 are surface mount contacts, such as flip-chip contacts for example. As there is no lower redistribution layer 110 in this configuration, operation 272 may be omitted.

At 273, wafer-level processing may be used to form a redistribution layer 260 on a back side surface 265 of a wafer in which IC dies 10 are located. Through die vias 261 may extend from front side surface 11 to an opposite back side surface 265 of IC die 10. Interconnects 262 and contacts 112 may be formed in redistribution layer 260 for electrical conductivity with through die vias 261, and for electrical coupling of through die vias 261 in an outer third region 13, or 15, to contacts 112 in a middle third region 14 on an opposite surface of redistribution layer 260 from interconnection with an IC die 10 of WLP component 100. A back side surface of IC die 10 may be face-to-face with a lower side surface of redistribution layer 260 for interconnection of through die vias 261 with interconnects 262, and an upper surface of redistribution layer 260 may have surface mount contacts, such as pads, 112 for subsequent interconnection with another IC die 10.

Optionally, at 274, another IC die 10 may be obtained having surface mount contacts 122 in an inner third region 14 of a front side or lower surface thereof. At 274, such IC die 10 may be surface mounted for having surface mount contacts 112 of redistribution layer 260 coupled for electrical conductivity to contacts 122 of an upper bare IC die 10 with a lower surface of such IC die 10 face-to-face with an upper surface of redistribution layer 260.

At 275, a WLP microelectronic component 100, with or without such upper IC die 10 coupled thereto, may be tested at a wafer-level or after being diced, including without limitation being diced from a semiconductor or other wafer.

Figure 35:
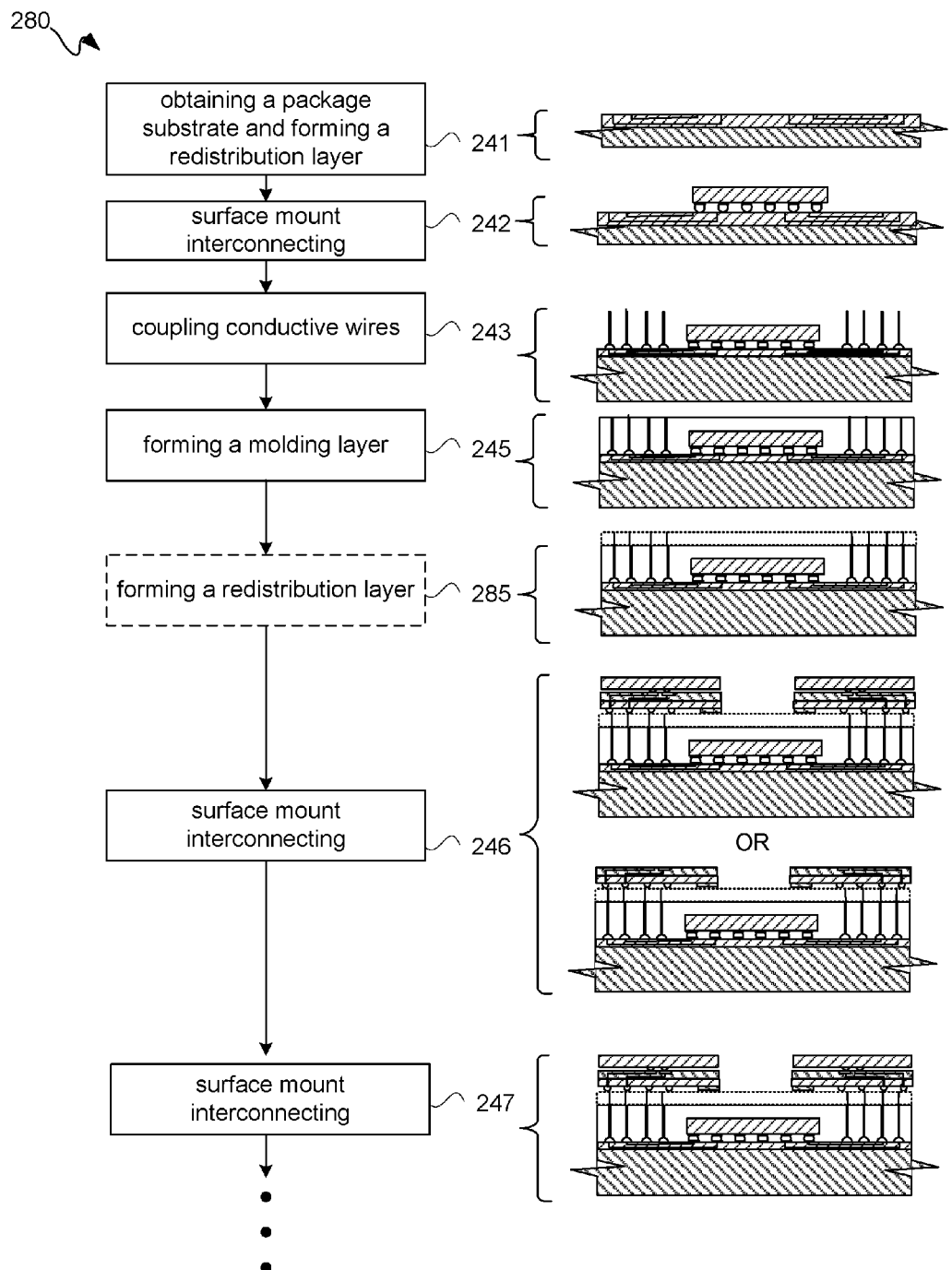
FIG. 35 is a flow diagram illustratively depicting an exemplary process flow for forming the package-on-package device of FIG. 34.

FIG. 35 is a flow diagram illustratively depicting an exemplary process flow for forming package-on-package device 200 of FIG. 34. FIG. 35 is further described with simultaneous reference to FIGS. 2-35, including in particular FIGS. 15 and 35.

Operations at 241 through 243 may be as previously described for forming a single WLP microelectronic components 100 level and an IC dies 10 level above such single WLP microelectronic components 100 level. Moreover, obtaining a package substrate at 241 may include forming a fan-out redistribution layer 239 with respect to integrated circuit die 210. Additionally, conductive lines or wires 215 may all terminate at generally a same height at operation 243, such as to be at or above a level of a molding layer, and so operation 244 may be omitted in this configuration. At 245 a molding layer 211 may be formed as previously described.

Optionally, at 285, a mezzanine redistribution layer 251 may be formed on an upper surface of molding layer 211 for interconnection with conductive lines or wires 215. At 246, surface mount interconnecting, such as flip-chip interconnecting, of WLP microelectronic components 100 above an upper surface 219 of molding layer 211 or an upper surface of optional redistribution layer 251 may be performed. For a PoP device 200 of FIG. 34, this interconnecting includes both fan-out and fan-in interconnects with respect to lower IC dies 10 having through die vias 261. If upper IC dies 10 are already coupled, then at 248 a molding layer 223 may be formed, as previously described, and process flow 280 may continue as previously described with reference to process flow 240.

If, however, upper IC dies 10 have not already been coupled to WLP microelectronic components 100 of FIG. 34, then at 247, surface mount interconnecting, such as flip-chip interconnecting for example, of upper IC dies 10 may be performed for PoP device 200 of FIG. 34, though of such IC dies 10. For surface mount interconnecting at 247 upper IC dies 10 may be surface mounted, such as by flip-chip interconnecting, to contacts 112 of redistribution layer 260.

At 248, a molding layer 223 may be formed over molding layer 211 for covering PoP device 200. At 249, PoP device 200 may be diced from a reconstituted wafer, if not manufactured as single component.

While the foregoing describes exemplary embodiment(s) in accordance with one or more aspects of the disclosure, other and further embodiment(s) in accordance with the one or more aspects of the disclosure may be devised without departing from the scope thereof, which is determined by the claim(s) that follow and equivalents thereof. Each claim of this document constitutes a separate embodiment, and embodiments that combine different claims and/or different embodiments are within the scope of the disclosure and will be apparent to those of ordinary skill in the art after reviewing this disclosure. Claim(s) listing steps do not imply any order of the steps. Trademarks are the property of their respective owners.

What is claimed is:

1. A wafer-level packaged microelectronic component, comprising:
    an integrated circuit die of a wafer having first contacts in an inner third region of a surface of the integrated circuit die;
    a first redistribution layer having second contacts in an inner third region of a first surface of the first redistribution layer and third contacts in an outer third region of a second surface of the first redistribution layer opposite the first surface thereof;
    the second contacts of the first redistribution layer coupled for electrical conductivity to the first contacts of the integrated circuit die with the surface of the integrated circuit die face-to-face with the first surface of the redistribution layer;
    a second redistribution layer having fourth contacts in an inner third region of a first surface of the second redistribution layer and interconnects in an outer third region of a second surface of the second redistribution layer opposite the first surface thereof; and
    the third contacts offset from the second contacts for being positioned in a fan-out region for association at least with the outer third region of the second surface of the first redistribution layer, the third contacts being surface mount contacts.

2. The microelectronic component according to claim 1, wherein:
    the first contacts and the second contacts correspond to one another; and
    the inner third region of each of the surface of the integrated circuit die and the first surface of the first redistribution layer correspond to one another.

3. The microelectronic component according to claim 2, wherein only the third contacts are externally available for interconnection on the first surface of the first redistribution layer.

4. The microelectronic component according to claim 1, wherein the integrated circuit die is part of a die stack.

5. The microelectronic component according to claim 1, wherein the surface of the integrated circuit die is a first surface thereof, the microelectronic component further comprising:
    the integrated circuit die having through die vias in an outer third region of the first surface thereof and a second surface opposite the first surface thereof;
    the interconnects of the second redistribution layer coupled for electrical conductivity to the through die vias of the integrated circuit die with the second surface of the integrated circuit die face-to-face with the second surface of the second redistribution layer; and
    the interconnects offset from the fourth contacts for being positioned in the fan-out region for association at least with the outer third region of the second surface of the second redistribution layer.

6. The microelectronic component according to claim 5, wherein the integrated circuit die is a first integrated circuit die, the microelectronic component further comprising:
    a second integrated circuit die having fifth contacts in an inner third region of a surface of the second integrated circuit die; and
    the fourth contacts of the second redistribution layer coupled for electrical conductivity to the fifth contacts of the second integrated circuit die with the surface of the second integrated circuit die face-to-face with the first surface of the second redistribution layer.

7. A method for forming a wafer-level packaged microelectronic component, comprising:
    obtaining an integrated circuit die of a wafer having first contacts in an inner third region of a surface of the integrated circuit die;
    wafer-level processing to form a first redistribution layer on the surface of the integrated circuit die, the first redistribution layer formed to have:
        second contacts in an inner third region of a first surface of the first redistribution layer interconnected to the first contacts of the integrated circuit die with the surface of the integrated circuit die face-to-face with the first surface of the first redistribution layer;
        third contacts in an outer third region of a second surface of the first redistribution layer opposite the first surface thereof coupled for electrical conductivity to the second contacts; and
        the third contacts offset from the second contacts for being positioned in a fan-out region for association at least with the outer third region of the second surface of the first redistribution layer, the third contacts being surface mount contacts; and
    wafer-level processing to form a second redistribution layer having fourth contacts in an inner third region of a first surface of the second redistribution layer and interconnects in an outer third region of a second surface of the second redistribution layer opposite the first surface thereof.

8. The method according to claim 7, wherein:
    the first contacts and the second contacts correspond to one another; and
    the inner third region of each of the surface of the integrated circuit die and the first surface of the first redistribution layer correspond to one another.

9. The method according to claim 8, wherein only the third contacts are externally available for interconnection on the second surface of the first redistribution layer.

10. The method according to claim 7, wherein the integrated circuit die is part of a die stack.

11. A method for forming a wafer-level packaged microelectronic component, comprising:
    obtaining an integrated circuit die of a wafer having first contacts in an inner third region of a first surface of the integrated circuit die;
    wafer-level processing to form a first redistribution layer on the first surface of the integrated circuit die, the first redistribution layer formed to have:
        second contacts in an inner third region of a first surface of the first redistribution layer interconnected to the first contacts of the integrated circuit die with the first surface of the integrated circuit die face-to-face with the first surface of the first redistribution layer;
        third contacts in an outer third region of a second surface of the first redistribution layer opposite the first surface thereof coupled for electrical conductivity to the second contacts; and the third contacts offset from the second contacts for being positioned in a fan-out region for association at least with the outer third region of the second surface of the first redistribution layer, the third contacts being surface mount contacts;

wafer-level processing to form a second redistribution layer on a second surface of the integrated circuit die opposite the first surface thereof, the second redistribution layer formed to have fourth contacts in an inner third region of a first surface of the second redistribution layer and interconnects in an outer third region of a second surface of the second redistribution layer opposite the first surface thereof;

the integrated circuit die having through die vias in an outer third region of the first surface and a second surface opposite the first surface;

the interconnects of the second redistribution layer coupled for electrical conductivity to the through die vias of the integrated circuit die with the second surface of the integrated circuit die face-to-face with the second surface of the second redistribution layer; and the interconnects offset from the fourth contacts for being positioned in the fan-out region for association at least with the outer third region of the second surface of the second redistribution layer.

12. The method according to claim 11, wherein:

the first contacts and the second contacts correspond to one another; and the inner third region of each of the surface of the integrated circuit die and the first surface of the redistribution layer correspond to one another.

13. The method according to claim 12, wherein only the third contacts are externally available for interconnection on the second surface of the redistribution layer.

14. The method according to claim 11, wherein the integrated circuit die is part of a die stack.

15. The method according to claim 11, wherein the integrated circuit die is a first integrated circuit die, the method further comprising:

obtaining a second integrated circuit die having fifth contacts in an inner third region of a surface of the second integrated circuit die; and surface mounting the second integrated circuit die for having the fourth contacts of the second redistribution layer coupled for electrical conductivity to the fifth contacts of the second integrated circuit die with the surface of the second integrated circuit die face-to-face with the first surface of the second redistribution layer.

16. A wafer-level packaged microelectronic component, comprising:

an integrated circuit die of a wafer having first contacts in an inner third region of a first surface of the integrated circuit die and through die vias in an outer third region of the first surface of the integrated circuit die;

a first redistribution layer having second contacts in an inner third region of a first surface of the first redistribution layer and first interconnects in an outer third region of a second surface of the first redistribution layer opposite the first surface thereof;

the first interconnects of the first redistribution layer coupled for electrical conductivity to the through substrate vias of the integrated circuit die with a second surface of the integrated circuit die opposite the first surface thereof face-to-face with the second surface of the first redistribution layer;

a second redistribution layer having third contacts in an inner third region of a first surface of the second redistribution layer and second interconnects in an outer third region of a second surface of the second redistribution layer opposite the first surface thereof; and the second contacts offset from the first interconnects for being positioned in a fan-out region for association at least with the outer third region of the second surface of the first redistribution layer, the second contacts being surface mount contacts.

17. The microelectronic component according to claim 16, wherein the inner third region of each of the first surface of the integrated circuit die and the first surface of the first redistribution layer correspond to one another.

18. The microelectronic component according to claim 16, wherein the integrated circuit die is a first integrated circuit die, the microelectronic component further comprising:

a second integrated circuit die having fourth contacts in an inner third region of a surface of the second integrated circuit die; and the third contacts of the second redistribution layer coupled for electrical conductivity to the fourth contacts of the second integrated circuit die with the surface of the second integrated circuit die face-to-face with the first surface of the second redistribution layer.

19. A method for forming a wafer-level packaged microelectronic component, comprising:

obtaining an integrated circuit die of a wafer having first contacts in an inner third region of a first surface of the integrated circuit die and through die vias in an outer third region of the first surface of the integrated circuit die; and wafer-level processing to form a first redistribution layer on the first surface of the integrated circuit die, the first redistribution layer formed to have:

second contacts in an inner third region of a first surface of the first redistribution layer and first interconnects in an outer third region of a second surface of the first redistribution layer opposite the first surface thereof;

the first interconnects of the first redistribution layer coupled for electrical conductivity to the through substrate vias of the integrated circuit die with a second surface of the integrated circuit die opposite the first surface thereof face-to-face with the second surface of the first redistribution layer; and the second contacts offset from the first interconnects for being positioned in a fan-out region for association at least with the outer third region of the second surface of the first redistribution layer, the second contacts being surface mount contacts; and wafer-level processing to form a second redistribution layer having third contacts in an inner third region of a first surface of the second redistribution layer and second interconnects in an outer third region of a second surface of the second redistribution layer opposite the first surface thereof.

20. The method according to claim 19, wherein the integrated circuit die is a first integrated circuit die, the method further comprising:

obtaining a second integrated circuit die having fourth contacts in an inner third region of a surface of the second integrated circuit die; and coupling the third contacts of the second redistribution layer for electrical conductivity to the fourth contacts of the second integrated circuit die with the surface of the second integrated circuit die face-to-face with the first surface of the second redistribution layer.

* * * * *